(12) United States Patent
Iwabuchi

(10) Patent No.: US 11,398,514 B2
(45) Date of Patent: Jul. 26, 2022

(54) SOLID-STATE IMAGE PICKUP DEVICE, MANUFACTURING METHOD THEREFOR, AND ELECTRONIC APPARATUS

(71) Applicant: SONY SEMICONDUCTOR SOLUTIONS CORPORATION, Kanagawa (JP)

(72) Inventor: Shin Iwabuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 31 days.

(21) Appl. No.: 16/766,444

(22) PCT Filed: Mar. 6, 2019

(86) PCT No.: PCT/JP2019/008734
§ 371 (c)(1),
(2) Date: May 22, 2020

(87) PCT Pub. No.: WO2019/181489
PCT Pub. Date: Sep. 26, 2019

(65) Prior Publication Data
US 2021/0151478 A1 May 20, 2021

(30) Foreign Application Priority Data
Mar. 20, 2018 (JP) .............................. JP2018-052462

(51) Int. Cl.
*H01L 27/146* (2006.01)
(52) U.S. Cl.
CPC ...... *H01L 27/1463* (2013.01); *H01L 27/1461* (2013.01); *H01L 27/1464* (2013.01);
(Continued)

(58) Field of Classification Search
CPC .......... H01L 27/14647; H01L 27/14652; H01L 27/1463; H01L 27/1461; H01L 27/1464; H01L 27/14641; H01L 27/14612–14616
See application file for complete search history.

(56) References Cited

U.S. PATENT DOCUMENTS

2010/0117126 A1  5/2010  Takahashi
2011/0181749 A1  7/2011  Yamada
(Continued)

FOREIGN PATENT DOCUMENTS

| JP | 2014-225560 | 12/2014 |
| JP | 2015-162603 | 9/2015 |
| WO | WO 2016/136486 | 9/2016 |

OTHER PUBLICATIONS

International Search Report and Written Opinion prepared by the Japanese Patent Office dated May 22, 2019, for International Application No. PCT/JP2019/008734.

*Primary Examiner* — Yu Chen
(74) *Attorney, Agent, or Firm* — Sheridan Ross P.C.

(57) ABSTRACT

The present technology relates to a solid-state image pickup device that suppresses dark current while increasing the saturated charge amount, a manufacturing method therefor, and an electronic apparatus. The device includes a first photoelectric converter on a front surface side opposite to a light incident surface side of a substrate; a second photoelectric converter stacked on the first photoelectric converter; and a pixel isolation section, the pixel isolation section passing through the substrate. The first photoelectric converter includes a first plane-direction PN junction region joined in a plane direction parallel to a light incident surface of the substrate and a first perpendicular-direction PN junction region along a side wall of the pixel isolation section. The second photoelectric converter includes a second plane-direction PN junction region and a second perpendicular- (Continued)

direction PN junction region. The present technology can also be applied to a solid-state image pickup device or the like, for example.

13 Claims, 22 Drawing Sheets

(52) U.S. Cl.
CPC .. *H01L 27/14605* (2013.01); *H01L 27/14614* (2013.01); *H01L 27/14641* (2013.01); *H01L 27/14647* (2013.01); *H01L 27/14683* (2013.01)

(56) References Cited

U.S. PATENT DOCUMENTS

| | | |
|---|---|---|
| 2016/0093659 A1 | 3/2016 | Nakamura et al. |
| 2016/0247848 A1 | 8/2016 | Nakamura et al. |
| 2017/0243906 A1 | 8/2017 | Nakamura et al. |
| 2017/0243912 A1* | 8/2017 | Kaneda ............... H04N 9/04557 |
| 2018/0013981 A1 | 1/2018 | Lee et al. |
| 2018/0033809 A1 | 2/2018 | Tayanaka et al. |
| 2018/0294304 A1* | 10/2018 | Janssens ........... H01L 27/14638 |
| 2019/0043901 A1* | 2/2019 | Honda ................... H04N 5/369 |
| 2019/0172868 A1* | 6/2019 | Chen ................. H01L 27/14625 |
| 2019/0348460 A1* | 11/2019 | Chen ................. H01L 27/14627 |
| 2019/0379844 A1* | 12/2019 | Chen ................. H01L 27/14614 |
| 2020/0168648 A1* | 5/2020 | Kudoh .............. H01L 27/14614 |

* cited by examiner

A

B

C

D

SOLID-STATE IMAGE PICKUP DEVICE, MANUFACTURING METHOD THEREFOR, AND ELECTRONIC APPARATUS

CROSS REFERENCE TO RELATED APPLICATIONS

This application is a national stage application under 35 U.S.C. 371 and claims the benefit of PCT Application No. PCT/JP2019/008734 having an international filing date of 6 Mar. 2019, which designated the United States, which PCT application claimed the benefit of Japanese Patent Application No. 2018-052462 filed 20 Mar. 2018, the entire disclosures of each of which are incorporated herein by reference.

TECHNICAL FIELD

The present technology relates to a solid-state image pickup device, a manufacturing method therefor, and an electronic apparatus, more particularly to a solid-state image pickup device enabled to suppress increase of dark current while increasing a saturated charge amount, a manufacturing method therefor, and an electronic apparatus.

BACKGROUND ART

Various propositions for increasing a saturated charge amount (Qs) in a solid-state image pickup element have been made.

For example, Patent Literature 1 has proposed the following structure. In this structure, a trench passing through a semiconductor substrate is formed between pixels, a P-type impurity region and an N-type impurity region are formed in side walls thereof, and a wide PN junction region is secured. In this way, the saturated charge amount is increased.

CITATION LIST

Patent Literature

Patent Literature 1: Japanese Patent Application Laid-open No. 2015-162603

DISCLOSURE OF INVENTION

Technical Problem

However, in the structure of Patent Literature 1, the N-type impurity region of the trench side wall reaches an interface of a substrate back surface which is on a light incident surface side. Pinning of the back-surface interface weakens and dark current increases, as a matter of concern.

The present technology has been made in view of the above-mentioned circumstances to enable increase of dark current to be suppressed while increasing the saturated charge amount.

Solution to Problem

A solid-state image pickup device according to a first aspect of the present technology includes: a first photoelectric converter formed on a front surface side opposite to a light incident surface side of a substrate; a second photoelectric converter stacked on the first photoelectric converter in a substrate depth direction; and a pixel isolation section formed at a boundary portion to an adjacent pixel, the pixel isolation section passing through the substrate. In the solid-state image pickup device, the first photoelectric converter includes a first plane-direction PN junction region in which a P-type impurity region and an N-type impurity region are joined with each other in a plane direction parallel to a light incident surface of the substrate and a first perpendicular-direction PN junction region in which a P-type impurity region and an N-type impurity region are joined with each other in a plane direction perpendicular to the light incident surface along a side wall of the pixel isolation section. The second photoelectric converter includes a second plane-direction PN junction region in which a P-type impurity region and an N-type impurity region are joined with each other in a plane direction parallel to the light incident surface and a second perpendicular-direction PN junction region in which a P-type impurity region and an N-type impurity region are joined with each other in the plane direction perpendicular to the light incident surface along the side wall of the pixel isolation section. An impurity region of a first conductivity type of the first perpendicular-direction PN junction region is disposed apart from an impurity region of a second conductivity type of the second plane-direction PN junction region by a first distance in the substrate depth direction, the second conductivity type being opposite to the first conductivity type. An impurity region of the first conductivity type of the second perpendicular-direction PN junction region is disposed apart from an impurity region of the second conductivity type of a back-surface-side interface of the substrate by a second distance in the substrate depth direction.

A manufacturing method for a solid-state image pickup device according to a second aspect of the present technology includes: forming a first photoelectric converter on a front surface side opposite to a light incident surface side of a substrate; forming a second photoelectric converter stacked on the first photoelectric converter in a substrate depth direction; and forming a pixel isolation section at a boundary portion to an adjacent pixel, the pixel isolation section passing through the substrate. In the manufacturing method for a solid-state image pickup device, the first photoelectric converter includes a first plane-direction PN junction region in which a P-type impurity region and an N-type impurity region are joined with each other in a plane direction parallel to a light incident surface of the substrate and a first perpendicular-direction PN junction region in which a P-type impurity region and an N-type impurity region are joined with each other in a plane direction perpendicular to the light incident surface along a side wall of the pixel isolation section. The second photoelectric converter includes a second plane-direction PN junction region in which a P-type impurity region and an N-type impurity region are joined with each other in a plane direction parallel to the light incident surface and a second perpendicular-direction PN junction region in which a P-type impurity region and an N-type impurity region are joined with each other in the plane direction perpendicular to the light incident surface along the side wall of the pixel isolation section. An impurity region of a first conductivity type of the first perpendicular-direction PN junction region is formed apart from an impurity region of a second conductivity type of the second plane-direction PN junction region by a first distance in the substrate depth direction, the second conductivity type being opposite to the first conductivity type. An impurity region of the first conductivity type of the second perpendicular-direction PN junction region is formed apart from an impurity region of the second conductivity type of a back-surface-side interface of the substrate by a second distance in the substrate depth direction.

An electronic apparatus according to a third aspect of the present technology includes a solid-state image pickup device. The solid-state image pickup device includes a first photoelectric converter formed on a front surface side opposite to a light incident surface side of a substrate, a second photoelectric converter stacked on the first photoelectric converter in a substrate depth direction, and a pixel isolation section formed at a boundary portion to an adjacent pixel, the pixel isolation section passing through the substrate. In the solid-state image pickup device, the first photoelectric converter includes a first plane-direction PN junction region in which a P-type impurity region and an N-type impurity region are joined with each other in a plane direction parallel to a light incident surface of the substrate and a first perpendicular-direction PN junction region in which a P-type impurity region and an N-type impurity region are joined with each other in a plane direction perpendicular to the light incident surface along a side wall of the pixel isolation section. The second photoelectric converter includes a second plane-direction PN junction region in which a P-type impurity region and an N-type impurity region are joined with each other in a plane direction parallel to the light incident surface and a second perpendicular-direction PN junction region in which a P-type impurity region and an N-type impurity region are joined with each other in the plane direction perpendicular to the light incident surface along the side wall of the pixel isolation section. An impurity region of a first conductivity type of the first perpendicular-direction PN junction region is disposed apart from an impurity region of a second conductivity type of the second plane-direction PN junction region by a first distance in the substrate depth direction, the second conductivity type being opposite to the first conductivity type. An impurity region of the first conductivity type of the second perpendicular-direction PN junction region is disposed apart from an impurity region of the second conductivity type of a back-surface-side interface of the substrate by a second distance in the substrate depth direction.

In the first to third aspects of the present technology, the first photoelectric converter is formed on the front surface side opposite to the light incident surface side of the substrate. The second photoelectric converter is formed, stacked on the first photoelectric converter in the substrate depth direction. The pixel isolation section is formed at the boundary portion to the adjacent pixel, the pixel isolation section passing through the substrate. The first photoelectric converter includes the first plane-direction PN junction region in which the P-type impurity region and the N-type impurity region are joined with each other in the plane direction parallel to the light incident surface of the substrate and the first perpendicular-direction PN junction region in which the P-type impurity region and the N-type impurity region are joined with each other in the plane direction perpendicular to the light incident surface along the side wall of the pixel isolation section. The second photoelectric converter includes the second plane-direction PN junction region in which the P-type impurity region and the N-type impurity region are joined with each other in the plane direction parallel to the light incident surface and the second perpendicular-direction PN junction region in which the P-type impurity region and the N-type impurity region are joined with each other in the plane direction perpendicular to the light incident surface along the side wall of the pixel isolation section. The impurity region of the first conductivity type of the first perpendicular-direction PN junction region is formed apart from the impurity region of the second conductivity type of the second plane-direction PN junction region by the first distance in the substrate depth direction, the second conductivity type being opposite to the first conductivity type. The impurity region of the first conductivity type of the second perpendicular-direction PN junction region is formed apart from the impurity region of the second conductivity type of the back-surface-side interface of the substrate by the second distance in the substrate depth direction.

The solid-state image pickup device and the electronic apparatus may be independent devices (apparatuses) or may be modules incorporated in other devices (apparatuses).

Advantageous Effects of Invention

In accordance with the first to third aspects of the present technology, it is possible to suppress increase of dark current while increasing the saturated charge amount.

It should be noted that the effects described here are not necessarily limitative and any effect described in the present disclosure may be provided.

MODE(S) FOR CARRYING OUT THE INVENTION

Hereinafter, modes (hereinafter, referred to as embodiments) for carrying out the present technology will be described. It should be noted that descriptions will be made in the following order.
1. Schematic Configuration Example of Solid-State Image Pickup Device
2. First Embodiment of Pixel
3. Manufacturing Method of First Embodiment
4. Second Embodiment of Pixel
5. Third Embodiment of Pixel
6. Fourth Embodiment of Pixel
7. Fifth Embodiment of Pixel
8. Usage Examples of Image Sensor
9. Example of Application to Electronic Apparatus
10. Example of Application to Internal Information Acquisition System
11. Example of Application to Endoscopic Surgery System
12. Example of Application to Movable Object

1. Schematic Configuration Example of Solid-State Image Pickup Device

Figure 1:
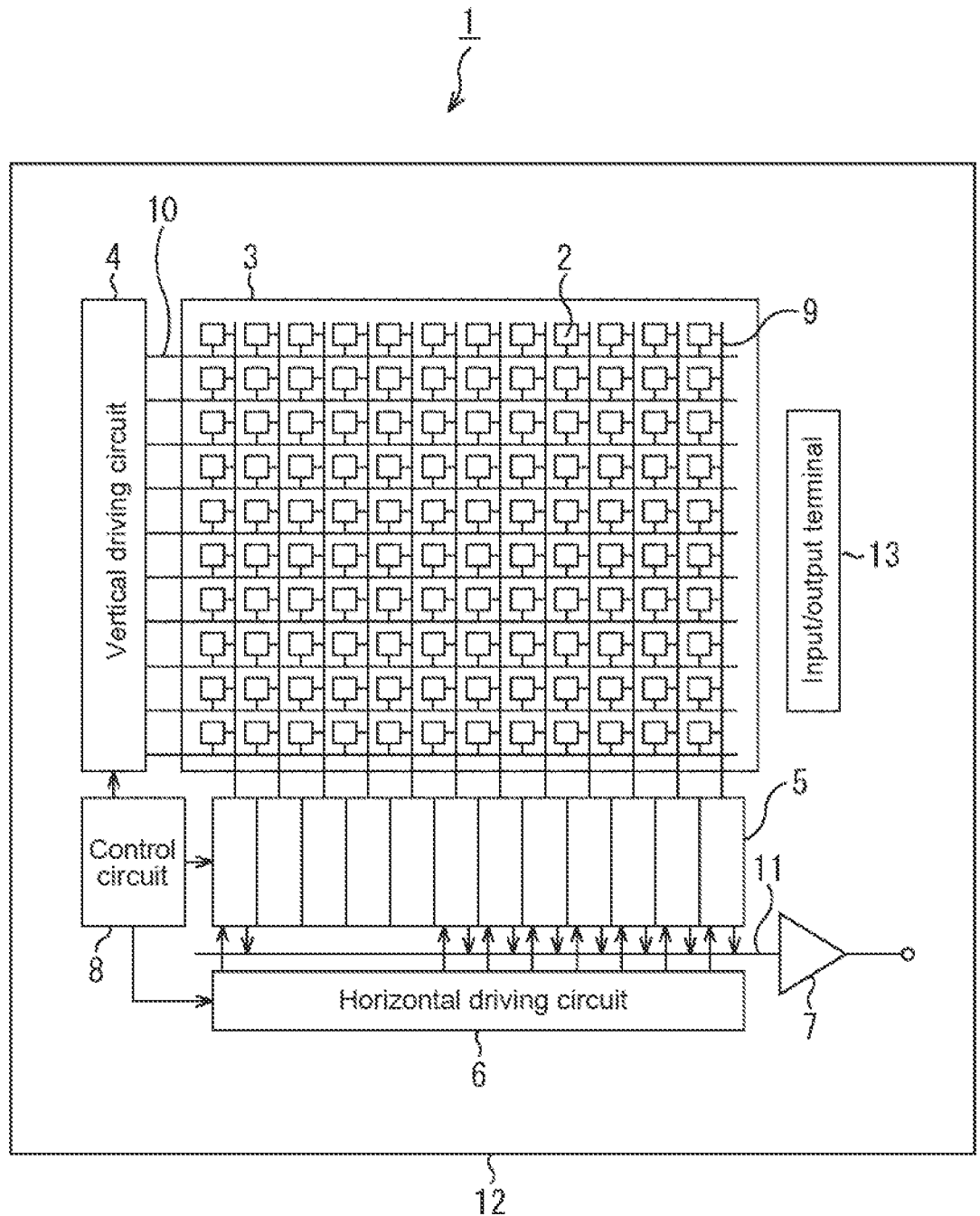
FIG. 1 A diagram showing a schematic configuration of a solid-state image pickup device to which the present technology is applied.

FIG. 1 shows a schematic configuration of a solid-state image pickup device to which the present technology is applied.

A solid-state image pickup device 1 of FIG. 1 includes a pixel array section 3 and a peripheral circuit section surrounding the pixel array section 3 on a semiconductor substrate 12. The semiconductor substrate 12 is made of, for example, silicon (Si) as a semiconductor. In the pixel array section 3, pixels 2 are arranged in the form of a two-dimensional array. The peripheral circuit section includes a vertical driving circuit 4, column signal processing circuits 5, a horizontal driving circuit 6, an output circuit 7, a control circuit 8, and the like.

The pixel 2 includes a photodiode and a plurality of pixel transistors. The PD serves as a photoelectric conversion element. The plurality of pixel transistors include four MOS transistors of a transfer transistor, a selection transistor, a reset transistor, and an amplification transistor, for example.

Further, the pixels 2 may be formed in a pixel sharing structure. The pixel sharing structure includes a plurality of photodiodes, a plurality of transmission transistors, a shared floating diffusion (hereinafter, referred to as FD), and other pixel transistors each of which is shared. In other words, the shared pixel is formed of the photodiodes and the transmission transistors, which form a plurality of unit pixels, sharing each of the other pixel transistors.

The control circuit 8 receives an input clock and data for commanding an operation mode or the like. Further, the control circuit 8 outputs data of internal information and the like of the solid-state image pickup device 1. That is, the control circuit 8 generates clock signals and control signals on the basis of vertical synchronization signals, horizontal synchronization signals, and master clock. Based on these clock signals and control signals, the vertical driving circuit 4, the column signal processing circuits 5, the horizontal driving circuit 6, and the like operate. Then, the control circuit 8 outputs the generated clock signals and control signals to the vertical driving circuit 4, the column signal processing circuits 5, the horizontal driving circuit 6, and the like.

The vertical driving circuit 4 includes, for example, a shift register. The vertical driving circuit 4 selects predetermined one of pixel driving wires 10, supplies the selected pixel driving wire 10 with pulses for driving the pixels 2, and drives the pixels 2 on a row-by-row basis. That is, the vertical driving circuit 4 sequentially selects and scans the pixels 2 of the pixel array section 3 on a row-by-row basis in a vertical direction. Then, the vertical driving circuit 4 supplies pixel signals based on signal charges generated in a manner that depends on the amount of light received at photoelectric converters of the pixels 2 to the column signal processing circuits 5 through vertical signal lines 9.

The column signal processing circuit 5 is disposed for each column of the pixels 2. The column signal processing circuit 5 performs signal processing such as noise canceling on signals output from the pixels 2 corresponding to one row, for each pixel column. For example, the column signal processing circuit 5 performs signal processing such as correlated double sampling (CDS) for canceling fixed-pattern noise specific to the pixels and AD conversion.

The horizontal driving circuit 6 includes, for example, a shift register. The horizontal driving circuit 6 sequentially outputs horizontal scan pulses, to thereby select each of the column signal processing circuits 5 in order. The horizontal driving circuit 6 causes each of the column signal processing circuits 5 to output pixel signals to a horizontal signal line 11.

The output circuit 7 processes and outputs signals sequentially supplied from each of the column signal processing circuits 5 through the horizontal signal line 11. For example, the output circuit 7 may perform only buffering or may perform black level adjustment, column variation correction, various types of digital signal processing, and the like. An input/output terminal 13 exchanges signals with the outside.

The thus configured solid-state image pickup device 1 is a CMOS image sensor. In the CMOS image sensor, the signal processing circuit 5 that performs CDS processing and AD conversion processing is disposed for each pixel column. Such a system is called column AD system.

2. First Embodiment of Pixel

Hereinafter, a pixel structure of a pixel 2 of the solid-state image pickup device 1 will be described.

Figure 2:
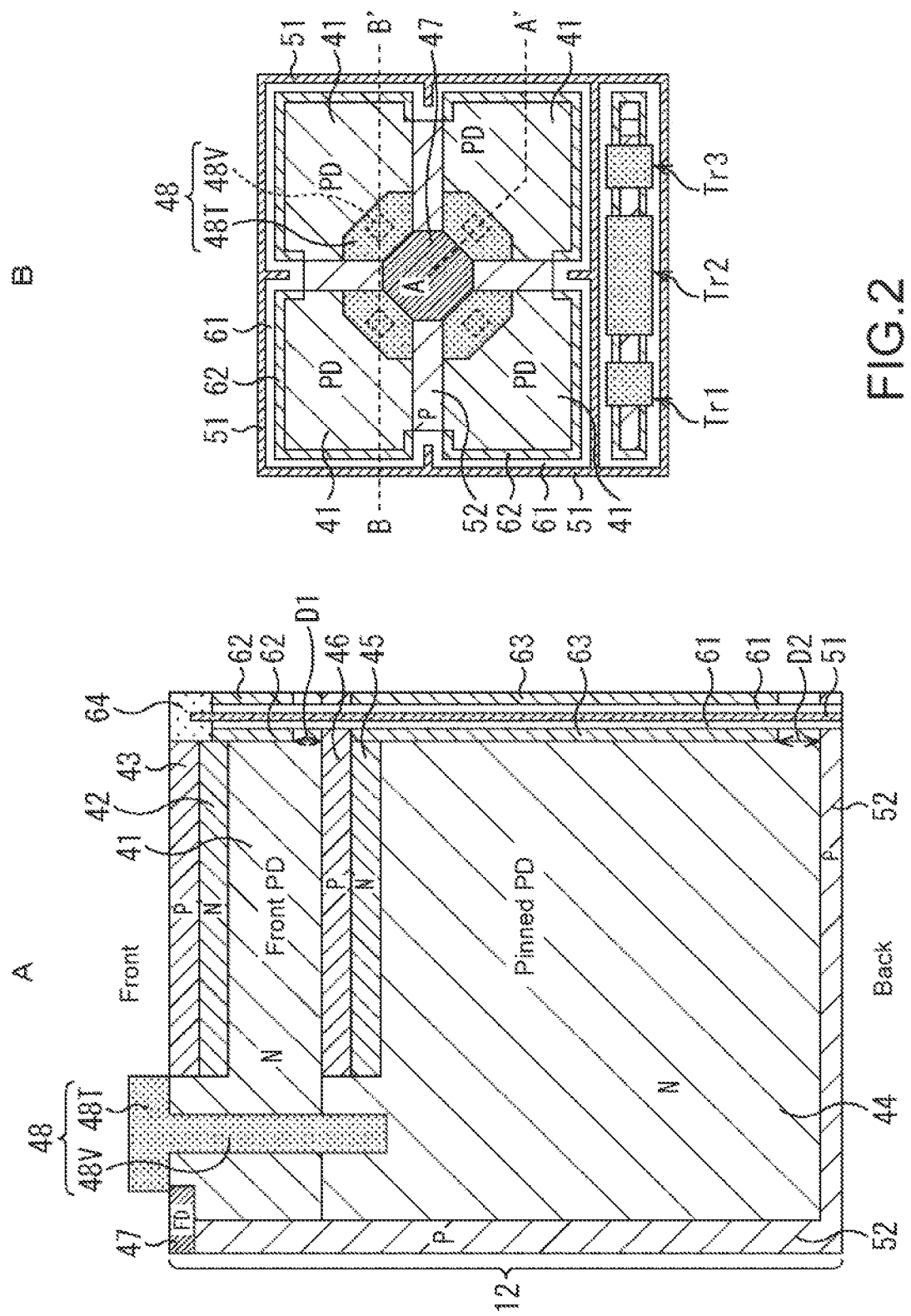
FIG. 2 A cross-sectional view and a plan view of a pixel according to a first embodiment.
Figure 3:
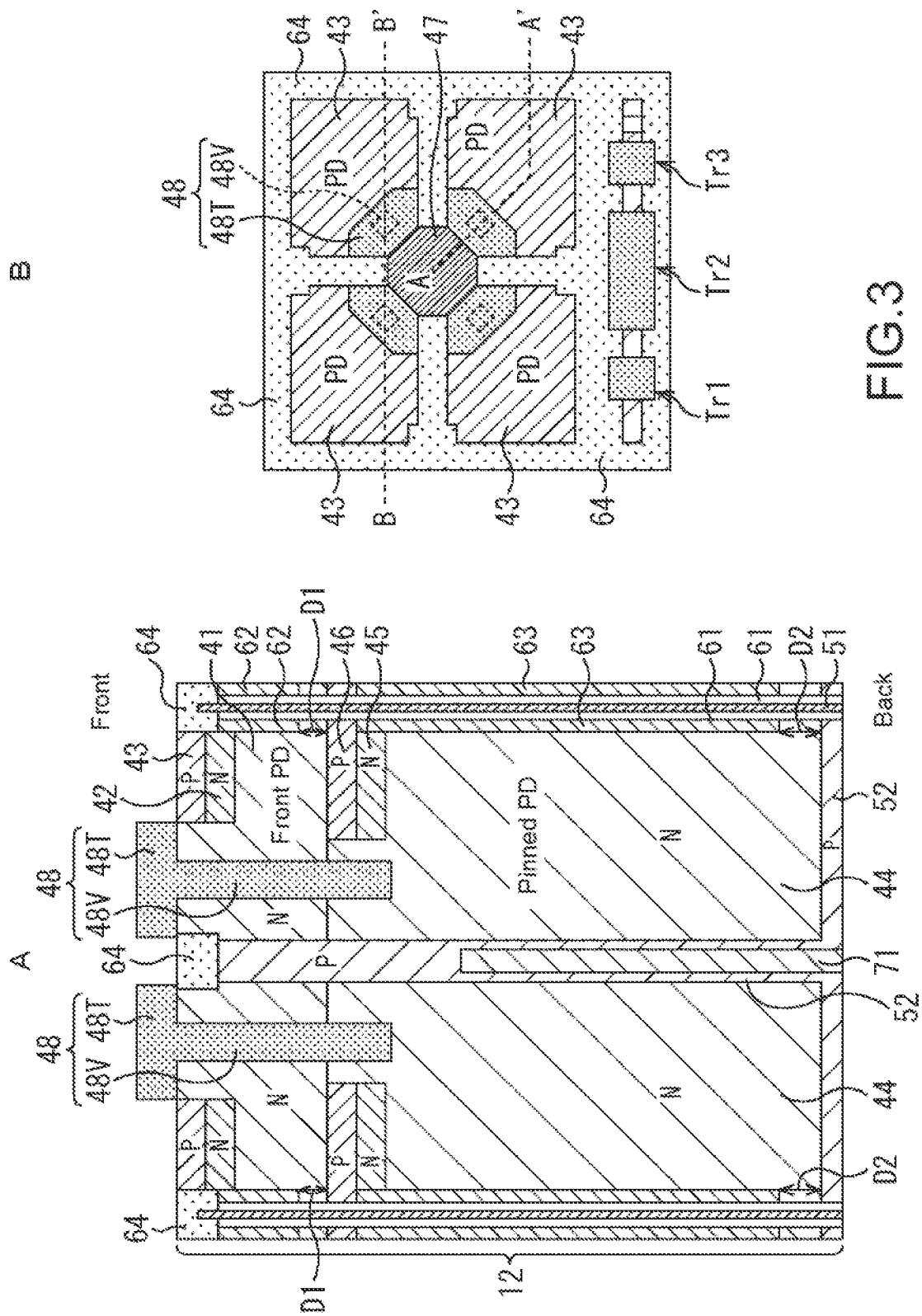
FIG. 3 A cross-sectional view and a plan view of the pixel according to the first embodiment.

FIGS. 2 and 3 show cross-sectional views and plan views each showing the pixel 2 according to the first embodiment.

Each of A of FIG. 2 and A of FIG. 3 is a cross-sectional view of the pixel 2 corresponding to one pixel. Each of B of FIG. 2 and B of FIG. 3 is a plan view in which two pixels 2 are arranged in each of the vertical direction and the horizontal direction, corresponding to four pixels of 2 by 2.

In A of FIG. 2 and A of FIG. 3, an upper side is a front surface side of the semiconductor substrate 12 and a multi-layer interconnection layer (not shown) including a plurality of interconnection layers and an inter-layer insulation film are formed. On the other hand, a lower side in A of FIG. 2 and A of FIG. 3 is a back side of the semiconductor substrate 12. On the lower side, there is a light incident surface that light enters. An on-chip lens and a color filter (both are not shown in the figures), for example, are formed in the light incident surface. Therefore, the solid-state image pickup device 1 is a backside illumination CMOS image sensor that photoelectrically converts light entering from the back side of the semiconductor substrate 12.

A of FIG. 2 corresponds to a cross-sectional view taken along the line A-A' of B of FIG. 2. A of FIG. 3 corresponds to a cross-sectional view taken along the line B-B' of B of FIG. 2.

Further, a plan view of B of FIG. 2 is a plan view from which some of members are omitted for the sake of easy understanding of the structure of the pixel 2. A plan view of B of FIG. 3 corresponds to a top view as viewed from the front surface side of the semiconductor substrate 12.

As shown in A of FIG. 2, the pixel 2 includes a front photodiode (PD) which is a first photoelectric converter formed on the front surface side opposite to a light incident surface side of the semiconductor substrate 12 and a pinned PD which is a second photoelectric converter stacked on the front PD in a substrate depth direction. Unless the front PD and the pinned PD are especially distinguished from each other, those will be simply referred to as PDs.

The front PD is constituted by an N-type impurity region 41, an N-type impurity region 42 set to have higher impurity concentration, and a P-type impurity region 43. The impurity concentration of the N-type impurity region 42 is about $10^{12}$ cm$^{-2}$ while the impurity concentration of the N-type impurity region 41 is about $10^{11}$ cm$^{-2}$, for example. The N-type impurity region 42 and the P-type impurity region 43 form a PN junction region in a plane direction parallel to the light incident surface of the semiconductor substrate 12 (hereinafter, referred to as plane-direction PN junction region). The N-type impurity region 42 having higher impurity concentration is a charge accumulation region in which charges (electrons) generated by photoelectric conversion are accumulated.

The pinned PD is constituted by an N-type impurity region 44, an N-type impurity region 45 set to have higher impurity concentration, and a P-type impurity region 46. The impurity concentration of the N-type impurity region 45 is about $10^{12}$ cm$^{-2}$ while the N-type impurity region 44 is about $10^{11}$ cm$^{-2}$, for example. The N-type impurity region 45 and the P-type impurity region 46 form a plane-direction PN junction region in the plane direction parallel to the light incident surface of the semiconductor substrate 12. The N-type impurity region 45 having higher impurity concentration is a charge accumulation region in which charges (electrons) generated by photoelectric conversion are accumulated.

In a region different from a forming region of the N-type impurity region 42 on a substrate front-surface-side interface, there are formed an FD 47 as a charge retention section that retains charges which can be obtained by photoelectric conversion and (a gate electrode of) a transfer transistor 48 that transfers charges to the FD 47. The transfer transistor 48 is constituted by a vertical transistor. The vertical transistor includes a plane gate electrode section 48T formed in an upper surface of the semiconductor substrate 12 and a vertical gate electrode section 48V extending in the substrate depth direction up to a depth reaching the N-type impurity region 44 of the pinned PD.

At a boundary portion to an adjacent pixel 2, which is an outer peripheral portion of the front PD and the pinned PD, a pixel isolation section 51 or a P-type impurity region 52 is formed. In this manner, that pixel 2 is separated from front PD and pinned PD of the adjacent pixel 2. Further, the P-type impurity region 52 is formed also in vicinity of a back-surface-side interface which is the light incident surface of the semiconductor substrate 12.

The pixel isolation section 51 is formed by embedding a material such as polysilicon and an oxide film ($SiO_2$) in a trench formed from the front surface side of the semiconductor substrate 12. On the substrate front-surface-side interface of the pixel isolation section 51, a shallow trench isolation (STI) 64 is formed.

A P-type impurity region 61 is formed on a side wall of the pixel isolation section 51. An N-type impurity region 62 is formed in the same substrate depth region as the front PD, which is an outer surface (upper surface) of the P-type impurity region 61. Therefore, on the side wall of the pixel isolation section 51 in the same substrate depth region as the front PD, a PN junction region (hereinafter, referred to as perpendicular-direction PN junction region) including the P-type impurity region 61 and the N-type impurity region 62 in a plane direction perpendicular to the light incident surface of the semiconductor substrate 12 is formed. The N-type impurity region 62 also functions as a charge accumulation region in which charges generated by photoelectric conversion are accumulated.

An end portion on the light incident surface side of the N-type impurity region 62 formed on the side wall of the pixel isolation section 51 in the region of the front PD is formed apart from the P-type impurity region 46, which is constitutes the pinned PD, by a predetermined distance D1 in the substrate depth direction.

In the same substrate depth region as the pinned PD, which is the outer surface (upper surface) of the P-type impurity region 61, an N-type impurity region 63 is formed. The impurity concentration of the N-type impurity regions 62 and 63 is set to be higher than that of the N-type impurity regions 41 and 44 as in the N-type impurity regions 42 and 45. Therefore, also on a side wall of the pixel isolation section 51 in the same substrate depth region as the pinned PD, a perpendicular-direction PN junction region including the P-type impurity region 61 and the N-type impurity region 63 in the plane direction perpendicular to the light incident surface of the semiconductor substrate 12 is formed. The N-type impurity region 63 also functions as a charge accumulation region in which charges generated by photoelectric conversion are accumulated.

An end portion on the light incident surface side of the N-type impurity region 63 formed on the side wall of the pixel isolation section 51 inside the region of the pinned PD is formed apart from the P-type impurity region 52, which is in vicinity of the substrate back-surface-side interface, by a predetermined distance D2 in the substrate depth direction.

As shown in B of FIG. 2, with respect to four pixels of 2 by 2, the FD 47 is disposed at the center of the four pixels and is shared with the four pixels. The transfer transistor 48 of each pixel 2 is disposed in vicinity of the FD 47 inside the rectangular pixel region. In addition, shared pixel transistors Tr1 to Tr3 to be shared with the four pixels are disposed outside front PDs and pinned PDs of the four pixels of 2 by 2 (on the lower side in B of FIG. 2). The shared pixel transistors Tr1 to Tr3 are any of a selection transistor, an amplification transistor, and a reset transistor, for example. Therefore, this solid-state image pickup device 1 has a shared pixel structure using the four pixels as a sharing unit.

In the outer peripheral portion of the front PD and the pinned PD of each pixel 2, the pixel isolation section 51 or the P-type impurity region 52 is formed at the boundary portion of the adjacent pixel 2. However, as shown in B of FIG. 2, the pixel isolation section 51 is formed at a boundary portion between sharing units and the P-type impurity region 52 is formed at a pixel boundary portion within the sharing unit.

As shown in A of FIG. 3, a rear deep trench isolation (RDTI) 71 is formed inside the P-type impurity region 52 at the pixel boundary portion within the sharing unit. The RDTI 71 is formed by embedding a material such as an oxide film ($SiO_2$) in the trench formed from the substrate back side, for example. With this RDTI 71, electrical and optical isolation capability of adjacent pinned PDs within the sharing unit can be enhanced.

As shown in B of FIG. 3, the STI 64 is formed on the substrate front-surface-side interface at the pixel boundary portion.

The pixel 2 according to the first embodiment is configured in the above-mentioned manner.

The pixel 2 according to the first embodiment includes a two-stage photoelectric converter of the front PD and the pinned PD stacked in the substrate depth direction. As the charge accumulation region that accumulates charges generated in the front PD, the pixel 2 according to the first embodiment includes the N-type impurity region 62 on the side wall of the pixel isolation section 51 which is next to the front PD as well as the N-type impurity region 42 formed in a plane-direction region. Further, as the charge accumulation region that accumulates charges generated in the pinned PD, the pixel 2 according to the first embodiment includes the N-type impurity region 63 on the side wall of the pixel isolation section 51 which is next to the pinned PD as well as the N-type impurity region 45 formed in a plane-direction region. Accordingly, it is possible to accumulate many charges and increase the saturated charge amount per pixel. Assuming that the saturated charge amount is not changed, the pixel size can be further reduced.

The end portion on the light incident surface side of the N-type impurity region 62 next to the front PD is formed apart from the P-type impurity region 46, which constitutes the pinned PD, by the predetermined distance D1 in the substrate depth direction. The end portion on the light incident surface side of the N-type impurity region 63 next to the pinned PD is formed apart from the P-type impurity region 52, which is in vicinity of the substrate back-surface-side interface, by the predetermined distance D2 in the substrate depth direction. Accordingly, pinning does not weak in the P-type impurity regions 46 and 52 and increase of dark current can be suppressed.

Therefore, in accordance with the pixel structure according to the first embodiment, it is possible to suppress increase of dark current while increasing the saturated charge amount.

Arrangement Example of Shared Pixel Transistors

Figure 4:
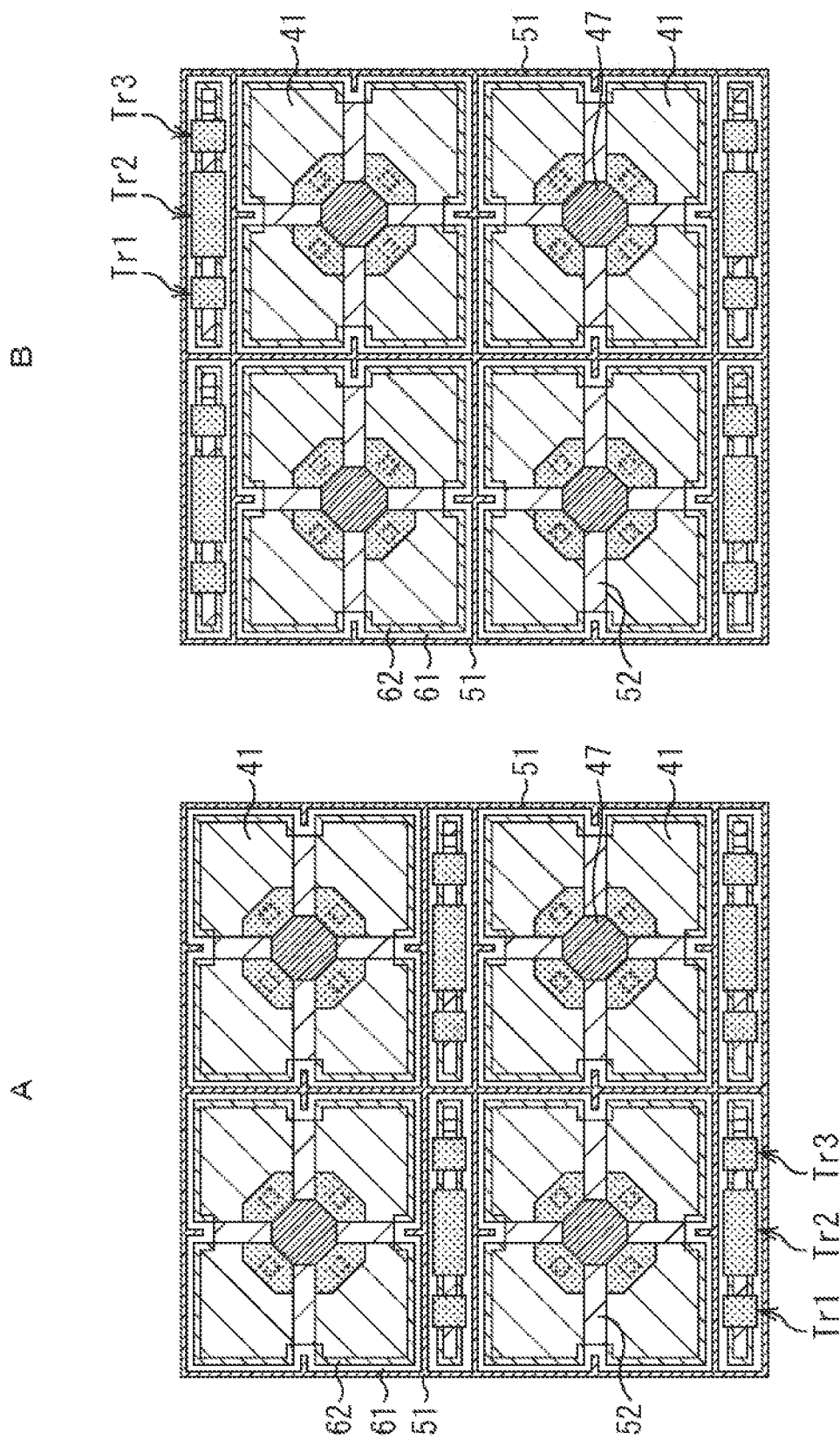
FIG. 4 A diagram showing a disposition example of shared pixel transistors.

FIG. 4 shows a disposition example of shared pixel transistors in the pixel array section 3.

In B of FIG. 2 and B of FIG. 3 shown above, the disposition example of the shared pixel transistors Tr1 to Tr3 in the single sharing unit is shown. A and B of FIG. 4 show a disposition example of the shared pixel transistors Tr1 to Tr3 in a case where a plurality of sharing units are arranged.

As shown in A of FIG. 4, the disposition of the plurality of shared pixel transistors Tr1 to Tr3 may be disposition in which the disposition shown in B of FIG. 2 is subsequently repeated in the horizontal direction and the vertical direction. Or, as shown in B of FIG. 4, the shared pixel transistors Tr1 to Tr3 of pixel rows adjacent to one another in the vertical direction may be disposed to be mirror symmetric to one another in the vertical direction. Alternatively, the disposition form of the plurality of shared pixel transistors Tr1 to Tr3 may be a disposition form other than that of A and B of FIG. 4.

Modified Example of First Embodiment

Figure 5:
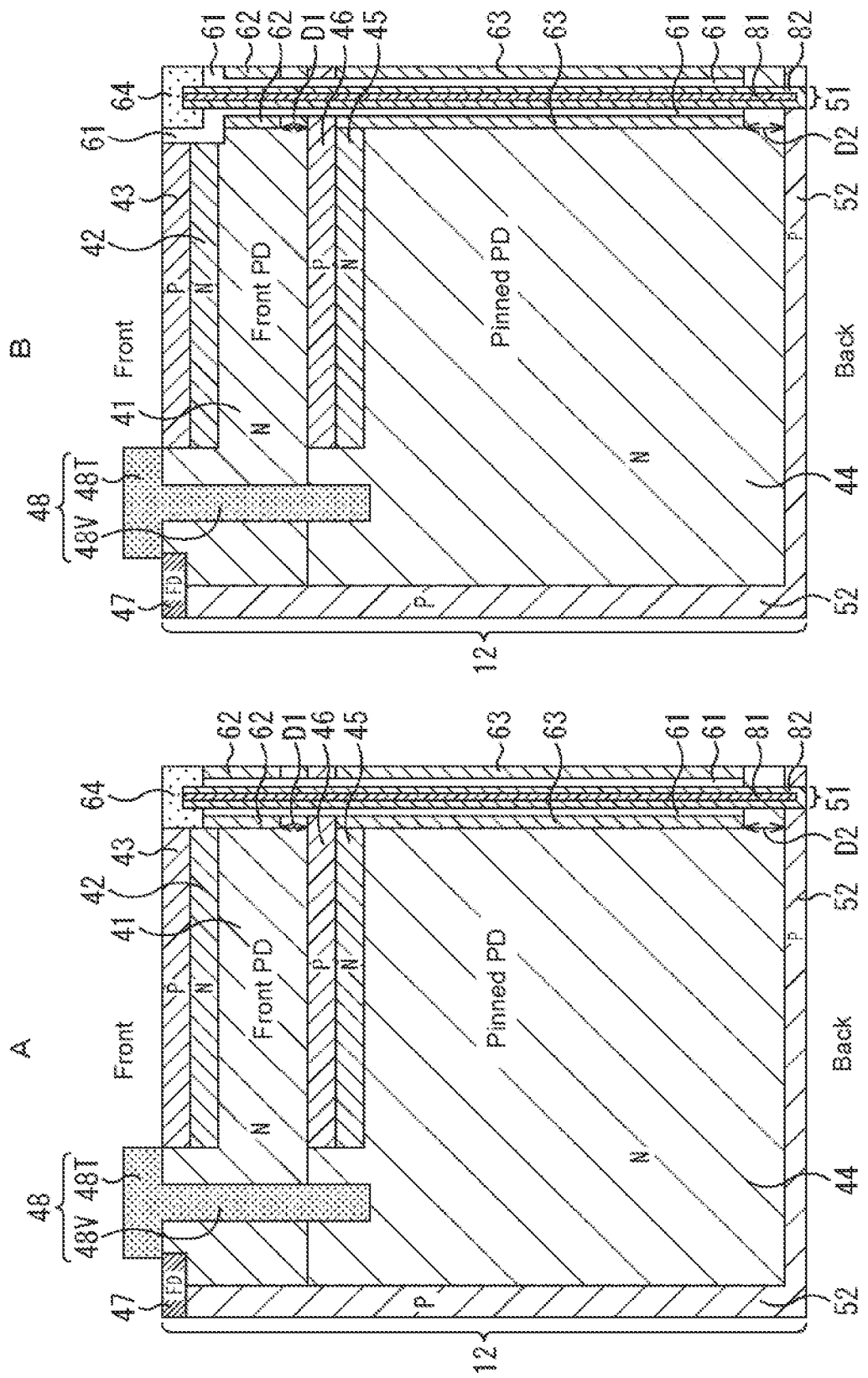
FIG. 5 A diagram showing a modified example of a pixel structure according to the first embodiment.

FIG. 5 shows a modified example of the pixel structure according to the first embodiment. In FIG. 5, portions corresponding to those of FIGS. 2 and 3 are denoted by the same signs. Descriptions of those portions will be omitted as appropriate and different portions will be mainly described.

A of FIG. 5 is a cross-sectional view of a first modified example of the pixel 2 according to the first embodiment.

As described above with reference to A and B of FIG. 2, the pixel isolation section 51 is formed at the boundary portion between the sharing units, which is outer peripheral portions of the PDs of the four pixels of 2 by 2. Polysilicon or an oxide film ($SiO_2$), for example, is used for the material of the pixel isolation section 51.

In contrast, in the first modified example shown in A of FIG. 5, the pixel isolation section 51 is formed of two layers of polysilicon 81 and an oxide film 82.

Further, in A and B of FIG. 2, the P-type impurity region 61 formed on the side wall of the pixel isolation section 51 passes through the semiconductor substrate 12 similarly to the pixel isolation section 51. In A of FIG. 5, the P-type impurity region 61 has the same substrate depth as the N-type impurity region 63.

The first modified example is similar to the first embodiment except for the point that the pixel isolation section 51 has a different configuration and the N-type impurity region 63 has a different substrate depth.

B of FIG. 5 is a cross-sectional view of a second modified example of the pixel 2 according to the first embodiment.

The second modified example of B of FIG. 5 is different in that the P-type impurity region 61 is formed also in the outer peripheral portion of the STI 64 formed on the substrate front-surface-side interface at the pixel boundary portion in addition to the same change points as the first modified example.

Regarding the pixel boundary portion, the structure as shown in A and B of FIG. 5 is also possible.

3. Manufacturing Method of First Embodiment

Next, with reference to FIGS. 6 and 7, a manufacturing method for a pixel 2 according to the first embodiment will be described. It should be noted that in FIGS. 6 and 7, a manufacturing method for a pixel having the pixel structure of the second modified example shown in B of FIG. 5 will be described.

Figure 6:
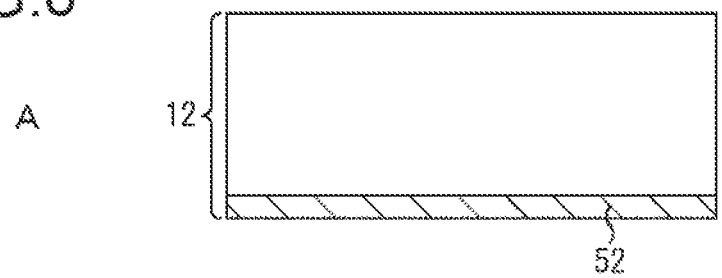
FIG. 6 A diagram describing a manufacturing method for a pixel according to the first embodiment.
Figure 6:
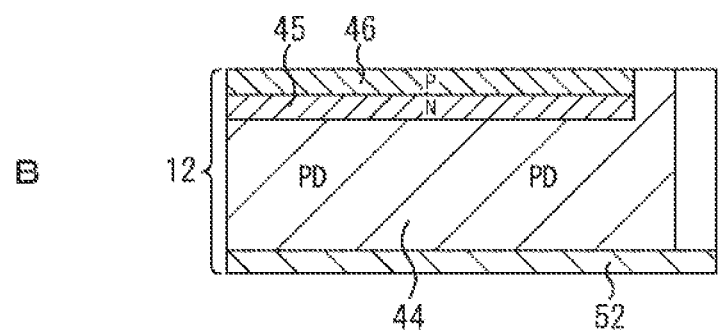
Figure 6:
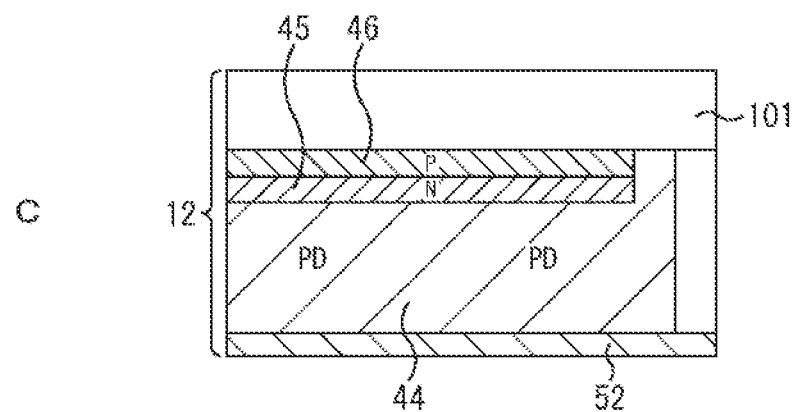
Figure 6:
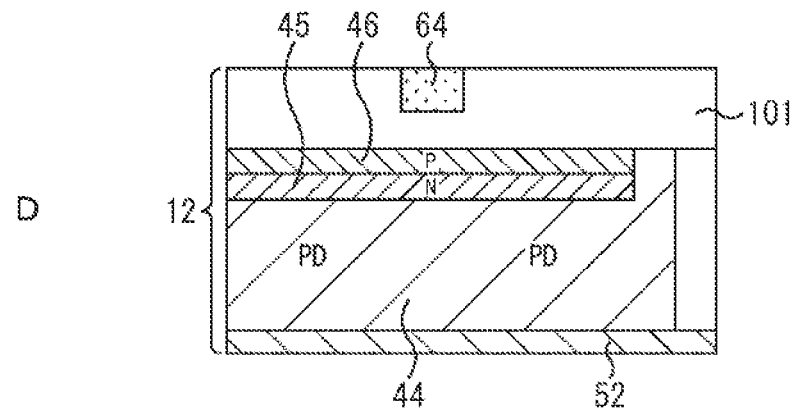

First of all, the P-type impurity region 52 is formed by performing ion implantation with P-type impurities such as boron (B) in an interface vicinity region on the back side of the semiconductor substrate 12, using silicon (Si), for example, as a semiconductor as shown in A of FIG. 6.

Next, the N-type impurity regions 44 and 45 of the pinned PD are formed by performing ion implantation on N-type impurities such as phosphorus (P) and the like as shown in B of FIG. 6. In addition, by performing ion implantation on P-type impurities such as boron (B), the P-type impurity region 46 is formed. The N-type impurity region 45 is adjusted to have impurity concentration higher than that of the N-type impurity region 44, as described above.

Next, a silicon layer 101 is formed by epitaxial growth as shown in C of FIG. 6. Then, the STI 64 is formed at the pixel boundary portion as shown in D of FIG. 6.

Next, the pixel isolation section 51 including the two layers of the polysilicon 81 and the oxide film 82, the P-type impurity region 61 and the N-type impurity region 62 as the PN junction region next to the front PD, and the P-type impurity region 61 and the N-type impurity region 63 as the PN junction region next to the pinned PD are formed below the STI 64 at the pixel boundary portion as shown in A of FIG. 7. A method of forming this pixel boundary portion below the STI 64 will be described later with reference to FIGS. 8 to 10.

Figure 7:
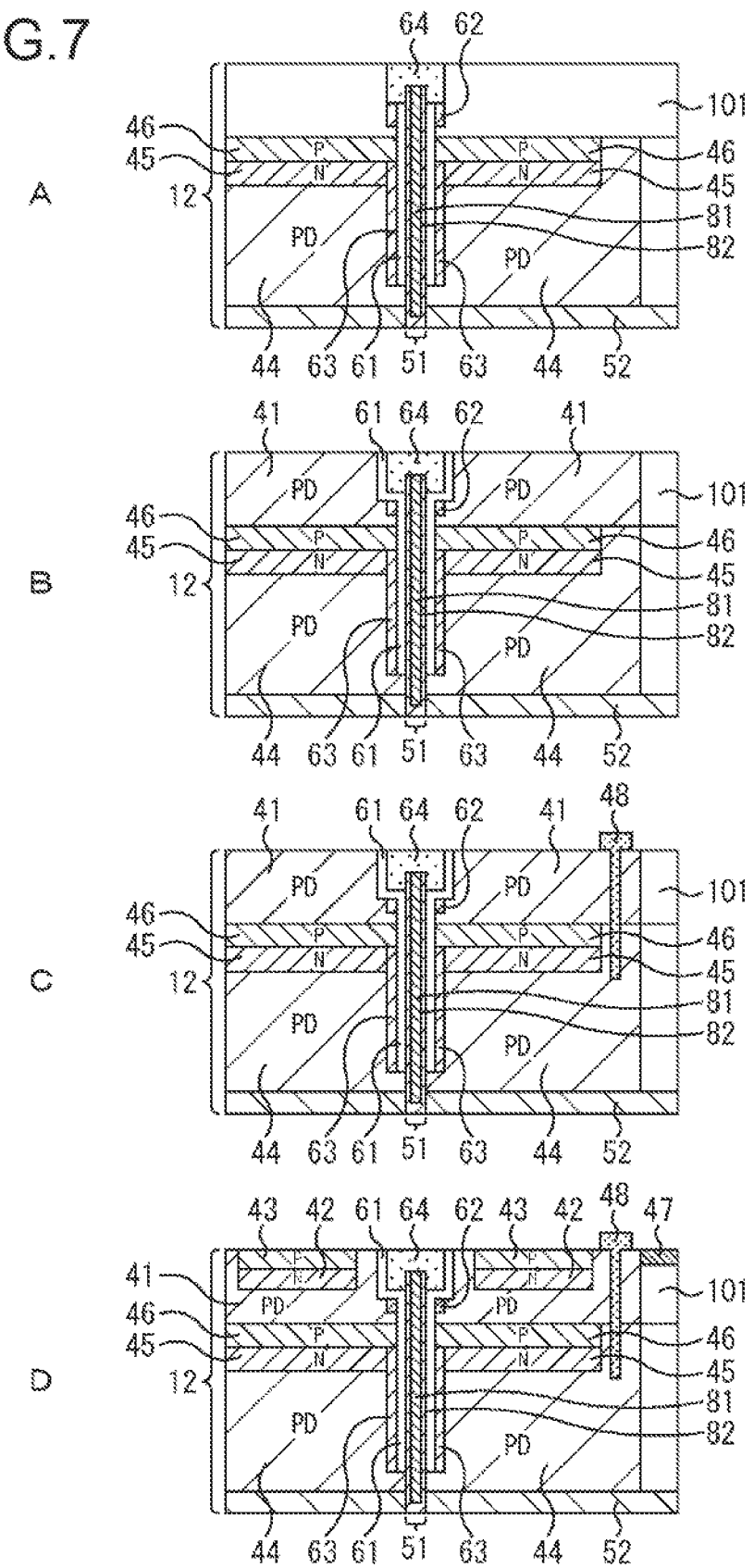
FIG. 7 A diagram describing a manufacturing method for a pixel according to the first embodiment.

Next, the N-type impurity region 41 of the front PD is formed by ion implantation with N-type impurities on the silicon layer 101 formed by epitaxial growth as shown in B of FIG. 7. Then, the P-type impurity region 61 is formed around the STI 64 by ion implantation with P-type impurities.

Next, the vertical transfer transistor 48 is formed as shown in C of FIG. 7. Then, the N-type impurity region 42 and the P-type impurity region 43 are formed by ion implantation with N-type impurities and ion implantation with P-type impurities in regions in vicinity of the front-surface-side interface of the semiconductor substrate 12 as shown in D of FIG. 7.

In addition, the FD 47 is formed on the substrate front-surface-side interface in vicinity of the transfer transistor 48 by ion implantation with N-type impurities as shown in D of FIG. 7. It should be noted that in a case of forming a side wall in a gate-electrode-side surface of the transfer transistor 48, the side wall is formed before the FD 47 is formed.

After the step of D of FIG. 7, the multi-layer interconnection layer on the front surface side of the semiconductor substrate 12 is formed and the trench is formed at the pixel boundary portion within the sharing unit from the front surface side of the semiconductor substrate 12. In this manner, the RDTI 71 for PD isolation is formed.

First Forming Method

Next, the step of forming the pixel isolation section 51 and the PN junction region below the STI 64 at the pixel boundary portion shown in A of FIG. 7 will be described in detail.

First of all, a first forming method for a pixel boundary portion including the pixel isolation section 51 and the PN junction region below the STI 64 will be described with reference to FIGS. 8 and 9.

Figure 8:
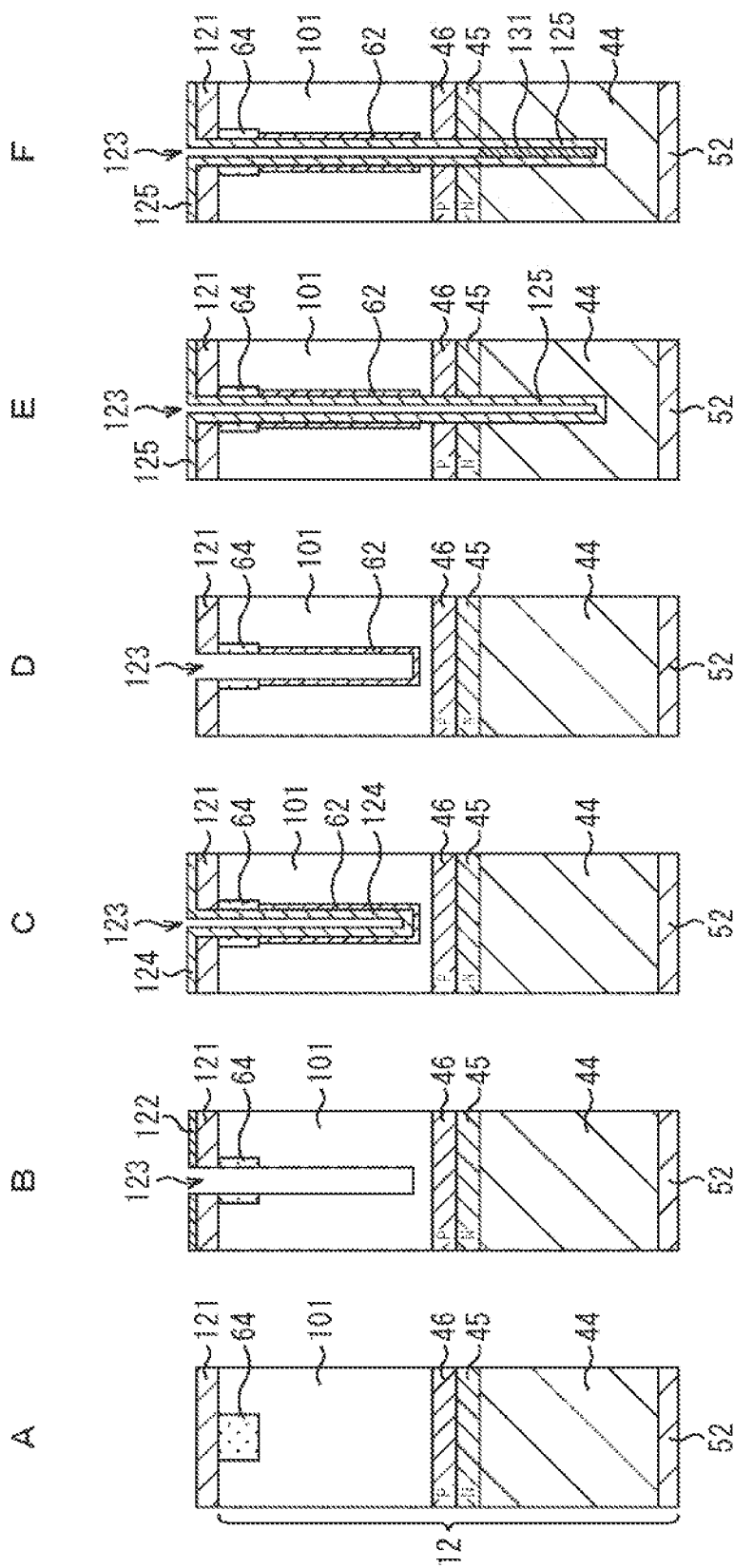
FIG. 8 A diagram describing a first forming method for a pixel boundary portion.

As shown in A of FIG. 8, a silicon oxide film 121 such as LP-TEOS is formed on the entire upper surface of the silicon layer 101 formed by epitaxial growth. A of FIG. 8 shows a state in which the silicon oxide film 121 is formed in the state after the STI 64 shown in D of FIG. 6 is formed.

Next, a resist 122 is deposited as a film on the upper surface of the silicon oxide film 121 as shown in B of FIG. 8. Only a predetermined upper region of the STI 64 is opened. Then, the silicon oxide film 121, the STI 64, and the silicon layer 101 are removed below the opened region of the resist 122 by dry etching. A deep trench 123 is formed. The width of the deep trench 123 is set to be smaller than that of the STI 64. The depth of the deep trench 123 is set such that the deep trench 123 does not reach the P-type impurity region 46 below it even in view of an etching process variation. The depth of the deep trench 123 is also set such that in a solid phase diffusion step of D of FIG. 8 to be described later, N-type impurities are diffused up to the P-type impurity region 46 below it and the effective impurity concentration of the P-type impurity region 46 is not lower than desired concentration. A plane region in which the deep trench 123 is formed is a region corresponding to the pixel isolation section 51 shown in B of FIG. 2.

Next, the resist 122 is removed as shown in C of FIG. 8. Then, a silicon oxide film (hereinafter, referred to as PSG film) 124 containing phosphorus (P) is deposited on the front surface of the semiconductor substrate 12 by atomic layer deposition (ALD), for example. As a result, the PSG film 124 is formed not only on the front surface of the semiconductor substrate 12 but also on the side and bottom surfaces of the deep trench 123. Then, heat treatment (annealing) is performed on the semiconductor substrate 12, such that the phosphorus of the PSG film 124 is diffused in the solid phase in a region in which the PSG film 124 and the silicon layer 101 are held in contact with each other. In this manner, the N-type impurity region 62 is formed.

Next, the PSG film 124 is removed by wet etching using hydrofluoric acid, for example, as shown in D of FIG. 8. A distance between the end portion on the light incident surface side of the N-type impurity region 62 on the side wall of the deep trench 123 and the P-type impurity region 46 in the substrate depth direction corresponds to the predetermined distance D1 shown in FIG. 2.

Next, the bottom surface of the deep trench 123 is further dug in the depth direction by dry etching, for example, and a PSG film 125 is formed again on the side and bottom surfaces of the deeply dug deep trench 123 and the front surface of the semiconductor substrate 12 as shown in E of FIG. 8. The depth of the deep trench 123 is set such that the deep trench 123 does not reach the P-type impurity region 52 on the substrate back side even in view of an etching process variation. The depth of the deep trench 123 is also set such that in a solid phase diffusion step of A of FIG. 9 to be described later, N-type impurities are diffused up to the P-type impurity region 52 below it and the effective impurity concentration of the P-type impurity region 52 is not lower than desired concentration.

Next, a resist 131 is applied on the entire upper surface of the semiconductor substrate 12 and the resist 131 is embedded in the deep trench 123 as shown in F of FIG. 8. Then, the resist 131 is removed up to a desired depth of the deep trench 123 by dry etching on the entire surface. The depth of the retracted resist 131 corresponds to a position deeper than the P-type impurity region 46. The depth of the resist 131 is set such that in subsequent heat treatment and process total heat treatment steps, N-type impurities are diffused up to the P-type impurity region 46 and the effective P-type concentration is not lower than desired concentration.

Figure 9:
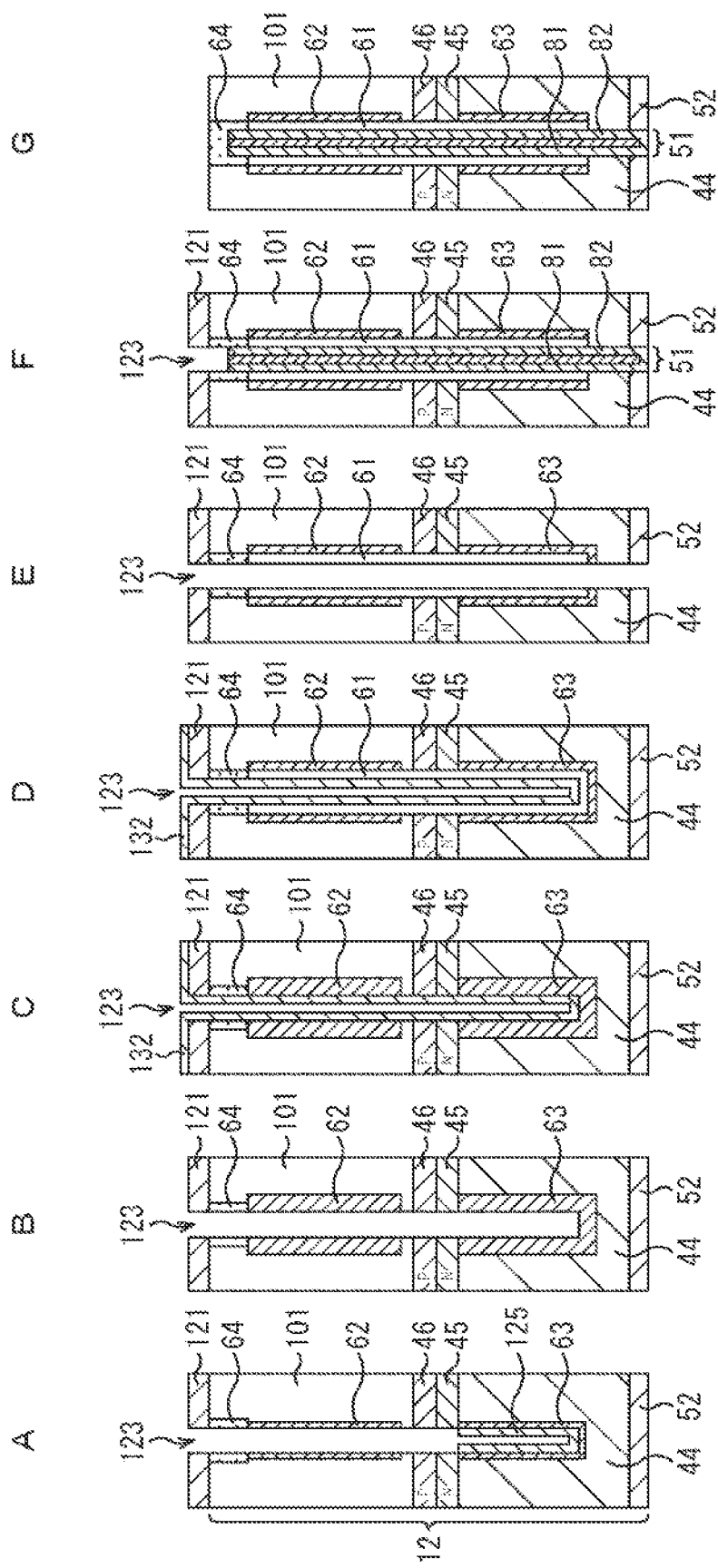
FIG. 9 A diagram describing the first forming method for a pixel boundary portion.

Next, the PSG film 125 above the resist 131 is, as shown in A of FIG. 9, removed by wet treatment such that the PSG film 125 which is a portion closed by the retracted resist 131 shown in F of FIG. 8. Then, the resist 131 is also pealed off. Then, heat treatment (annealing) is performed on the semiconductor substrate 12, such that the phosphorus of the PSG film 125 is diffused in the solid phase in a region in which the PSG film 125 and the N-type impurity region 44 are held in contact with each other. In this manner, the N-type impurity region 63 is formed.

Next, heat treatment is additionally performed after the PSG film 125 is removed as shown in B of FIG. 9. In this manner, phosphorus as N-type impurities is diffused. The N-type impurity region 62 and the N-type impurity region 63 are spread in the horizontal direction.

Next, a silicon oxide film (hereinafter, referred to as BSG film) 132 including boron (B) is deposited on the front surface of the semiconductor substrate 12 by atomic layer deposition (ALD), for example, as shown in C of FIG. 9. As a result, the BSG film 132 is formed not only on the front surface of the semiconductor substrate 12 but also on the side and bottom surfaces of the deep trench 123. Then, the boron of the BSG film 132 is diffused in the solid phase in a region in which the BSG film 132 and the N-type impurity region or the P-type impurity region are held in contact with each other by performing heat treatment (annealing) on the semiconductor substrate 12 as shown in D of FIG. 9. In this manner, the P-type impurity region 61 is formed.

Next, the BSG film 132 is pealed off by wet treatment as shown in E of FIG. 9. Then, the depth direction is further dug until the deep trench 123 completely passes through the semiconductor substrate 12.

In E of FIG. 9, a distance in the substrate depth direction between the end portion on the light incident surface side of the N-type impurity region 63 on the side wall of the deep trench 123 and the P-type impurity region 52 in vicinity of the substrate back-surface-side interface corresponds to the predetermined distance D2 shown in FIG. 2. This distance D2 is set to be longer than the distance D1 in D of FIG. 8. Since the deep trench 123 is formed by etching from the front surface side of the semiconductor substrate 12, the amount of etching variation is larger regarding the distance D2 which is at a deeper substrate position. By setting this distance D2 to be longer than the distance D1, adjustment can be made such that the end portion on the light incident surface side of the N-type impurity region 63 is not held in contact with the P-type impurity region 52 even in view of the amount of etching variation.

Next, the oxide film 82 and the polysilicon 81 that constitute the pixel isolation section 51 are formed in the stated order and the STI 64 is etched back to a predetermined depth as shown in F of FIG. 9.

Next, the pixel isolation section 51 is closed by the STI 64 by embedding the oxide film in an upper portion of the pixel isolation section 51 and flattening it by CMP as shown in G of FIG. 9. G of FIG. 9 corresponds to the state of A of FIG. 7.

In accordance with the above-mentioned first forming method for a pixel boundary portion, the P-type impurity region 61 and the N-type impurity regions 62 and 63 on the side wall of the deep trench 123 can be formed in self alignment by solid phase diffusion. The solid phase diffusion of N-type impurities is executed two times for forming the N-type impurity regions 62 and 63. First solid phase diffusion is performed in the depth region of the front PD, using the PSG film 124. Second solid phase diffusion is performed in the depth region of the pinned PD, using the PSG film 125.

In the second solid phase diffusion performed in the depth region of the pinned PD according to the first forming method, the PSG film 125 is formed to be left only in the depth region portion of the pinned PD. In this manner, solid phase diffusion is performed only in the depth region portion of the pinned PD.

Second Forming Method

Next, a second forming method for a pixel boundary portion including the pixel isolation section 51 and the PN junction region below the STI 64 will be described with reference to FIG. 10.

Figure 10:
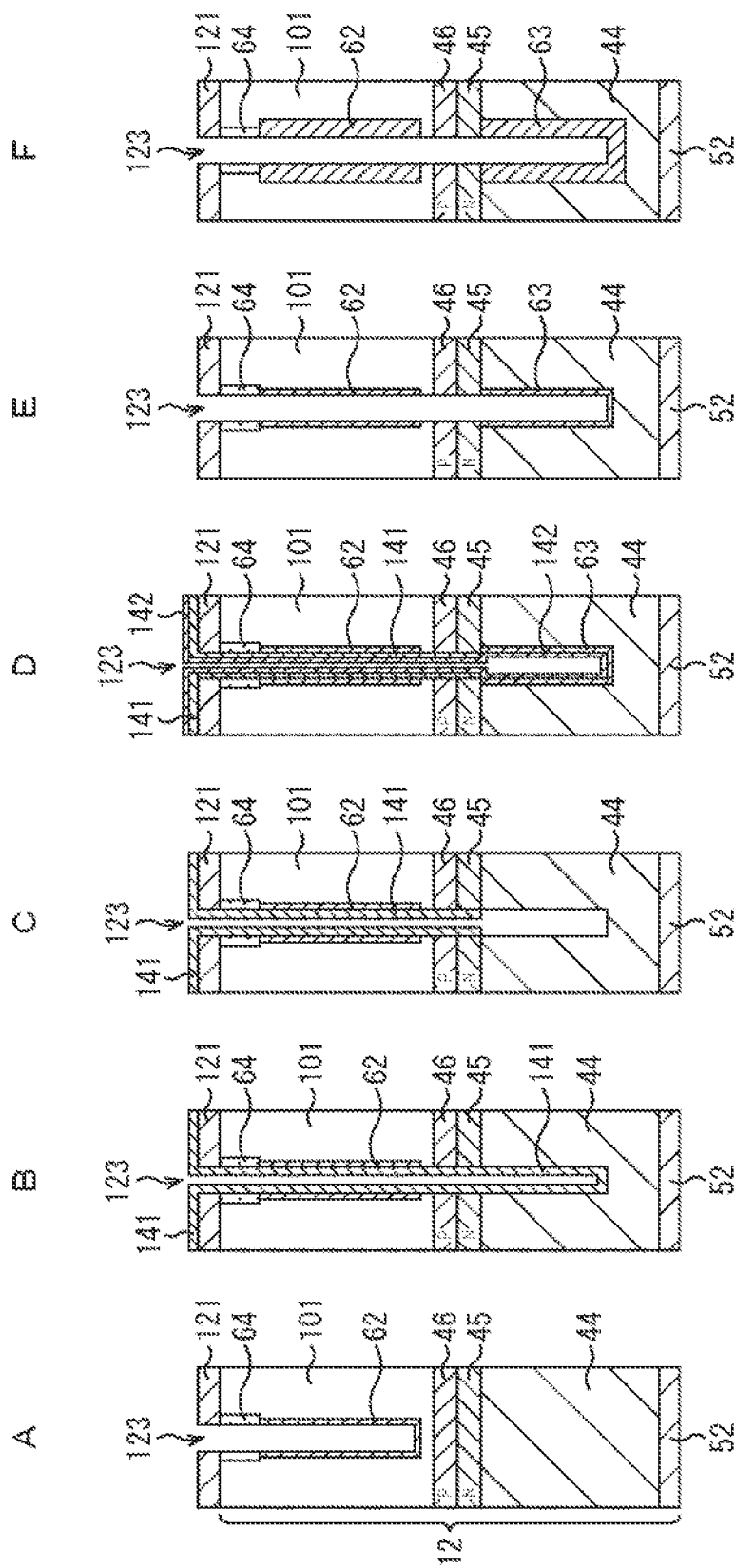
FIG. 10 A diagram describing a second forming method for a pixel boundary portion.

A of FIG. 10 is the same state as D of FIG. 8 according to the first forming method. Steps before A of FIG. 10 are similar to the steps described with reference to A to D of FIG. 8 according to the first forming method. Therefore, descriptions thereof will be omitted.

As shown in A of FIG. 10, the deep trench 123 is formed in the silicon layer 101 formed by epitaxial growth and the N-type impurity region 62 is formed.

Next, the bottom surface of the deep trench 123 is further dug in the depth direction by dry etching, for example, as shown in B of FIG. 10. Further, a protection film 141 is formed on the side and bottom surfaces of the deeply dug deep trench 123 and the front surface of the semiconductor substrate 12. The depth of the deep trench 123 is set such that the deep trench 123 does not reach the P-type impurity region 52 on the front surface side of the substrate even in view of an etching process variation. The depth of the deep trench 123 is also set such that in heat treatment and process total heat treatment steps of D of FIG. 10 to be described later, N-type impurities are diffused up to the P-type impurity region 52 below it and the effective impurity concentration of the P-type impurity region 52 is not lower than desired concentration.

Next, the protection film 141 is removed by wet treatment such that the protection film 141 is left only in a region which should not be diffused in the solid phase as shown in C of FIG. 10. Specifically, a portion of the protection film 141, which is at a position deeper than the P-type impurity region 46, is removed.

Next, a PSG film 142 is formed on the side and bottom surfaces of the deeply dug deep trench 123 and the front surface of the semiconductor substrate 12 as shown in D of FIG. 10. Then, the phosphorus of the PSG film 142 is diffused in the solid phase in a region in which the PSG film 142 and the N-type impurity region 44 are held in contact with each other by performing heat treatment on the semiconductor substrate 12. In this manner, the N-type impurity region 63 is formed.

Next, the PSG film 142 and the protection film 141 are removed by wet treatment as shown in E of FIG. 10. Then, heat treatment is additionally performed. In this manner, phosphorus as N-type impurities is diffused and the N-type impurity region 62 and the N-type impurity region 63 are spread in the horizontal direction as shown in F of FIG. 10.

F of FIG. 10 is the same as B of FIG. 9 shown in the first forming method. Subsequent steps are similar to those according to the first forming method. Therefore, descriptions thereof will be omitted.

Also in the above-mentioned second forming method for a pixel boundary portion, the P-type impurity region 61 and the N-type impurity regions 62 and 63 on the side wall of the deep trench 123 can be formed in self alignment by solid phase diffusion. The solid phase diffusion of N-type impurities is executed two times for forming the N-type impurity regions 62 and 63. First solid phase diffusion is performed in the depth region of the front PD, using the PSG film 124. Second solid phase diffusion is performed in the depth region of the pinned PD, using the PSG film 125.

In the second solid phase diffusion performed in the depth region of the pinned PD according to the second forming method, the PSG film 125 is formed from the uppermost portion to the lowermost portion of the deep trench 123. A portion other than the depth region portion of the pinned PD is protected by the protection film 141. In this manner, solid phase diffusion is performed only in the depth region portion of the pinned PD.

4. Second Embodiment of Pixel

Figure 11:
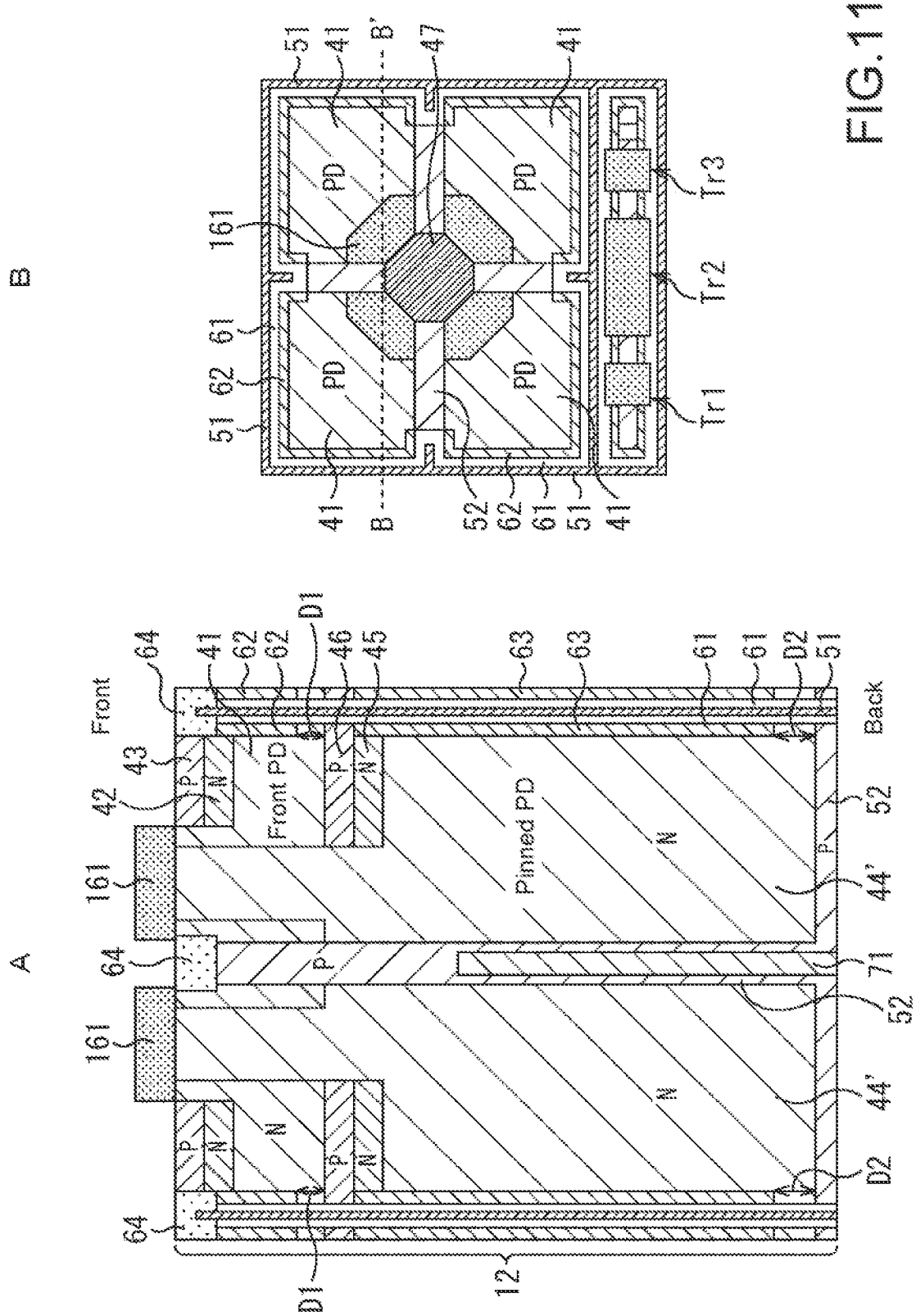
FIG. 11 A cross-sectional view and a plan view of a pixel according to a second embodiment.

FIG. 11 shows a cross-sectional view and a plan view of pixels 2 according to a second embodiment.

It should be noted that in the second to fifth embodiments to be described with reference to FIGS. 11 to 15, portions corresponding to those of the first embodiment will be denoted by the same signs. Descriptions thereof will be omitted as appropriate and different portions will be mainly described.

A of FIG. 11 is a cross-sectional view of the pixels 2 according to the second embodiment. B of FIG. 11 is a plan view in which two pixels 2 according to the second embodiment are arranged in each of the vertical direction and the horizontal direction, corresponding to four pixels of 2 by 2.

A of FIG. 11 corresponds to a cross-sectional view taken along the line B-B' of B of FIG. 11.

As it can be seen by comparing A of FIG. 11 with A of FIG. 3, the second embodiment is different from the first embodiment in that the transfer transistor 48 in the first embodiment is replaced by (a gate electrode of) a transfer transistor 161 without the vertical gate electrode section 48V extending in the substrate depth direction. Further, an N-type impurity region 44' of the pinned PD is formed up to a lower surface of the transfer transistor 161 in such a manner that it passes through the N-type impurity region 41 of the front PD and is held in contact with the interface of the semiconductor substrate 12.

Regarding the impurity concentration of the N-type impurity region 44', the impurity concentration of an interface vicinity region directly below the transfer transistor 161 is set to be higher than that of a deep region at a level equal to or lower than the level of the N-type impurity region 45. The impurity concentration of the N-type impurity region 44' is configured to easily transfer charges generated by photoelectric conversion of incident light due to potential gradient formed from the vicinity of the N-type impurity region 45 toward the transfer transistor 161 within the N-type impurity region 44'.

In a case where the vertical transfer transistor 48 is configured as in the first embodiment, accumulated charges can be reliably transferred even if the N-type impurity region 44 of the pinned PD is at a deep position with respect to the substrate front-surface interface. In a case where the transfer transistor 161 without the vertical gate electrode section 48V is employed as in the second embodiment, generation of noise and white spots can be easily suppressed and the number of processes can also be reduced.

5. Third Embodiment of Pixel

Figure 12:
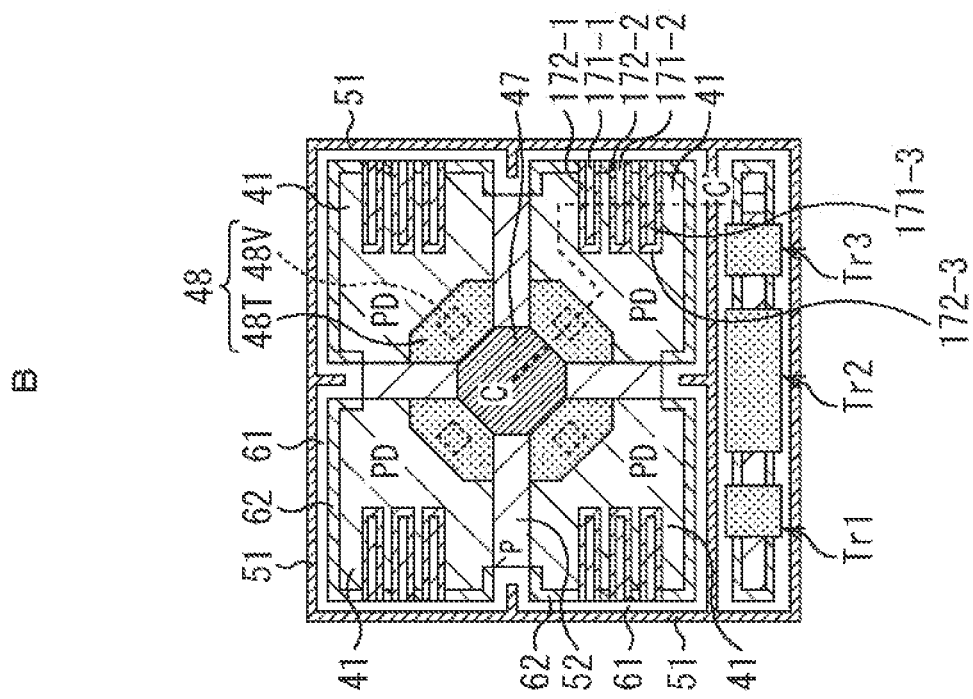
FIG. 12 A cross-sectional view and a plan view of a pixel according to a third embodiment.
Figure 12:
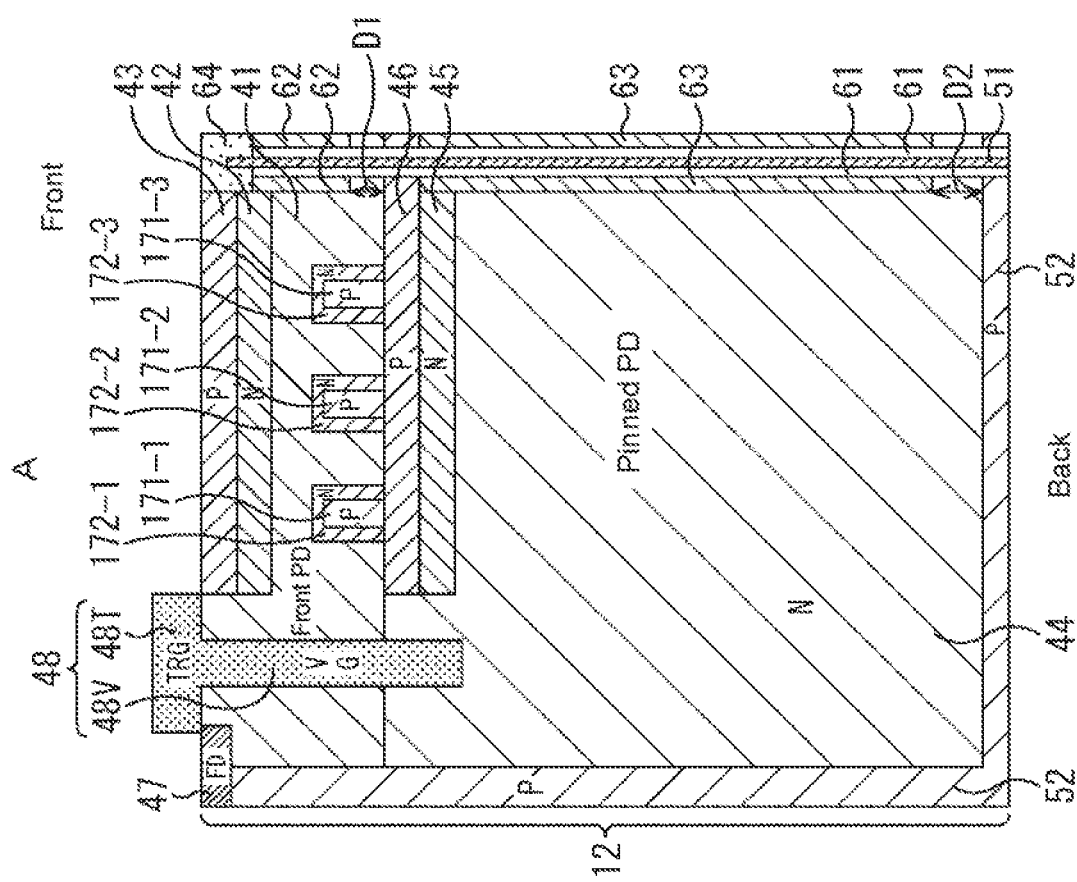

FIG. 12 shows a cross-sectional view and a plan view of pixels 2 according to a third embodiment.

A of FIG. 12 is a cross-sectional view of a pixel 2 according to the third embodiment. B of FIG. 12 is a plan view in which two pixels 2 according to the third embodiment are arranged in each of the vertical direction and the horizontal direction, corresponding to four pixels of 2 by 2.

A of FIG. 12 corresponds to a cross-sectional view taken along the line C-C' of B of FIG. 12.

The third embodiment of FIG. 12 is different from the first embodiment of FIG. 2 in that a plurality of three-dimensional PN junction regions (hereinafter, referred to as three-dimensional PN junction region) each including a P-type impurity region 171 and an N-type impurity region 172 is newly formed within the N-type impurity region 41 that constitutes the front PD. The three-dimensional PN junction region means that the junction region of the P-type impurity region and the N-type impurity region is not formed as a plane region but as a region corresponding to two or more of constituent surfaces of a rectangular parallelepiped.

In the example of FIG. 12, three three-dimensional PN junction regions are formed. Specifically, a three-dimensional PN junction region including a P-type impurity region 171-1 and an N-type impurity region 172-1, a three-dimensional PN junction region including a P-type impurity region 171-2 and an N-type impurity region 172-2, and a three-dimensional PN junction region including a P-type impurity region 171-3 and an N-type impurity region 172-3 are formed. However, the number of three-dimensional PN junction regions is not limited to three. The number of three-dimensional PN junction regions may be one, two, four, or more. The three-dimensional PN junction regions each including the P-type impurity region 171 and the N-type impurity region 172 are disposed apart from one another via the N-type impurity region 41. The three-dimensional PN junction region can be formed by ion implantation.

By forming one or more three-dimensional PN junction regions within the N-type impurity region 41 that constitutes the front PD in this manner, more charges can be accumulated and the saturated charge amount per pixel can be increased.

6. Fourth Embodiment of Pixel

Figure 13:
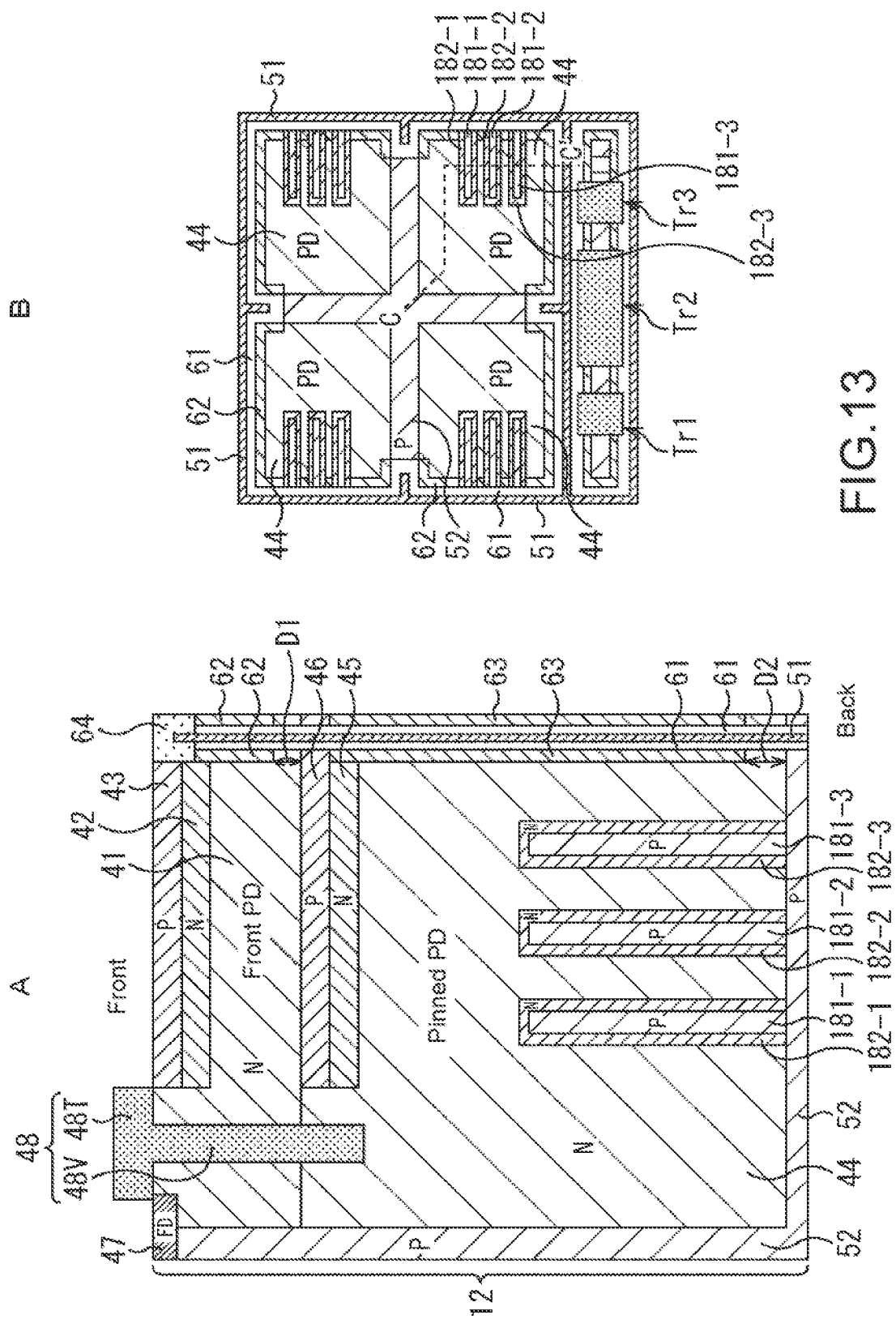
FIG. 13 A cross-sectional view and a plan view of a pixel according to a fourth embodiment.

FIG. 13 shows a cross-sectional view and a plan view of pixels 2 according to a fourth embodiment.

A of FIG. 13 is a cross-sectional view of the pixels 2 according to the fourth embodiment. B of FIG. 13 is a plan view in which two pixels 2 according to the fourth embodiment are arranged in each of the vertical direction and the horizontal direction, corresponding to four pixels of 2 by 2. It should be noted that a plan view of the pinned PDs, not the front PDs, are shown as the PD regions in B of FIG. 13.

A of FIG. 13 corresponds to a cross-sectional view taken along the line C-C' of B of FIG. 13.

The fourth embodiment of FIG. 13 is different from the first embodiment of FIG. 2 in that a plurality of three-dimensional PN junction regions each including a P-type impurity region 181 and an N-type impurity region 182 is newly formed within the N-type impurity region 44 that constitutes the pinned PD.

In the example of FIG. 13, three three-dimensional PN junction regions are formed. Specifically, a three-dimensional PN junction region including a P-type impurity region 181-1 and an N-type impurity region 182-1, a three-dimensional PN junction region including a P-type impurity region 181-2 and an N-type impurity region 182-2, and a three-dimensional PN junction region including a P-type impurity region 181-3 and an N-type impurity region 182-3 are formed. However, the number of three-dimensional PN junction regions is not limited to three. The number of three-dimensional PN junction regions may be one, two, four, or more. The three-dimensional PN junction regions each including the P-type impurity region 181 and the N-type impurity region 182 are disposed apart from one another via the N-type impurity region 44. The three-dimensional PN junction region can be formed by ion implantation.

By forming one or more three-dimensional PN junction regions within the N-type impurity region 44 that constitutes the pinned PD in this manner, more charges can be accumulated and the saturated charge amount per pixel can be increased.

It should be noted that not only the number of three-dimensional PN junction regions but also disposition positions are also not limited to the example of FIG. 13. As shown in B of FIG. 13, a comb teeth shape long in the horizontal direction may be employed. Or, a comb teeth shape long in the vertical direction may be employed, for example, as shown in B of FIG. 14. Moreover, the shape as viewed in a plan view is not limited to the vertically long shape and may be an island shape (dot shape). The same applies to the three-dimensional PN junction region according to the third embodiment shown in FIG. 12.

Figure 14:
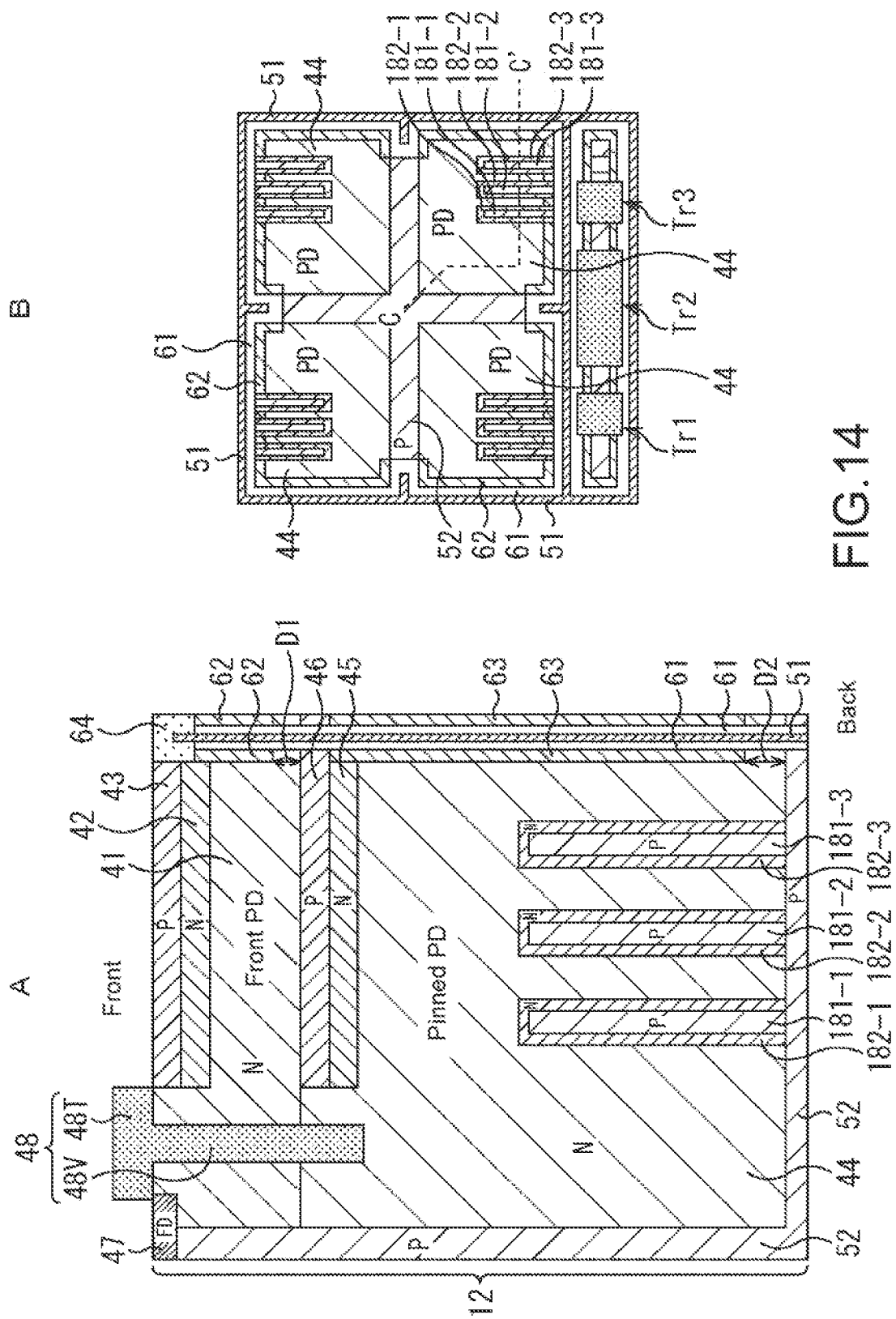
FIG. 14 A diagram showing a modified example of the pixel according to the fourth embodiment.

Further, a combination of the third embodiment shown in FIG. 12 with the fourth embodiment shown in FIGS. 13 and 14 can also be employed. That is, a structure including the three-dimensional PN junction region within the N-type impurity region 41 that constitutes the front PD and the three-dimensional PN junction region within the N-type impurity region 44 that constitutes the pinned PD can also be employed.

7. Fifth Embodiment of Pixel

Figure 15:
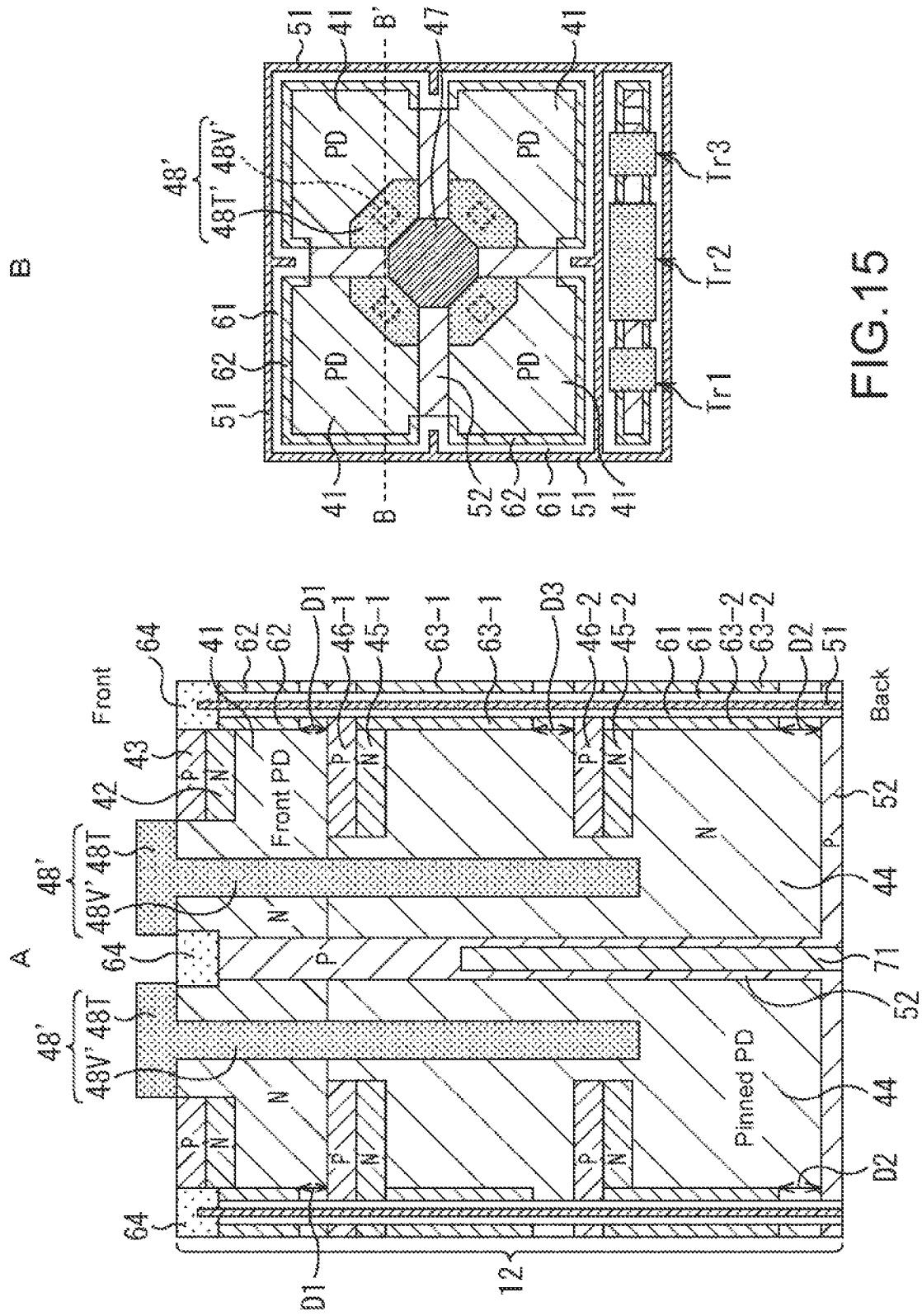
FIG. 15 A cross-sectional view and a plan view of a pixel according to a fifth embodiment.

FIG. 15 shows a cross-sectional view and a plan view of pixels 2 according to a fifth embodiment.

A of FIG. 15 is a cross-sectional view of the pixels 2 according to the fifth embodiment. B of FIG. 15 is a plan view in which two pixels 2 according to the fifth embodiment are arranged in each of the vertical direction and the horizontal direction, corresponding to four pixels of 2 by 2.

A of FIG. 15 corresponds to a cross-sectional view in the line B-B' in B of FIG. 15.

In the first embodiment of FIG. 2, the plane-direction PN junction region in the plane direction parallel to the light incident surface of the semiconductor substrate 12, which includes the N-type impurity region 45 and the P-type impurity region 46, and the perpendicular-direction PN junction region in the plane direction perpendicular to the light incident surface, which includes the P-type impurity region 61 and N-type impurity region 63 formed on the side wall of the pixel isolation section 51, are each formed within the N-type impurity region 44 that constitutes the pinned PD.

In contrast, in a fifth embodiment of FIG. 15, two layers each including the plane-direction PN junction region and the perpendicular-direction PN junction region are formed in the substrate depth direction within the N-type impurity region 44 that constitutes the pinned PD as shown in A of FIG. 15.

More specifically, a first plane-direction PN junction region including an N-type impurity region 45-1 and a P-type impurity region 46-1 and a first perpendicular-direction PN junction region including the P-type impurity region 61 and an N-type impurity region 63-1 are formed within an approximately upper half region of the N-type impurity region 44. Further, a second plane-direction PN junction region including an N-type impurity region 45-2 and a P-type impurity region 46-2 and a second perpendicular-direction PN junction region including the P-type impurity region 61 and an N-type impurity region 63-2 are formed within an approximately lower half region of the N-type impurity region 44. Here, an end portion on the light incident surface side of the N-type impurity region 63-1 that constitutes the first perpendicular-direction PN junction region is formed apart from the P-type impurity region 46-2 in the lower layer thereof by a predetermined distance D3 in the substrate depth direction.

In addition, corresponding to the two layers each including the plane-direction PN junction region and the perpendicular-direction PN junction region, a transfer transistor 48' in which the vertical gate electrode section 48V of the transfer transistor 48 according to the first embodiment is replaced by a vertical gate electrode section 48V' is provided. That is, the transfer transistor 48' having the vertical gate electrode section 48V' formed long (deep) up to a depth reaching the N-type impurity region 45-2 of the second plane-direction PN junction region which is the charge accumulation region which is the lower layer. The plane-direction PN junction region can be formed by performing ion implantation for the two layers.

It should be noted that although the example of FIG. 15 is an example in which the two layers each including the plane-direction PN junction region and the perpendicular-direction PN junction region are formed, the three or more layers each including the plane-direction PN junction region and the perpendicular-direction PN junction region may be formed as the layers.

By forming a plurality of layers each including the plane-direction PN junction region and the perpendicular-direction PN junction region within the N-type impurity region 44 that constitutes the pinned PD in this manner, more charges can be accumulated and the saturated charge amount per pixel can be increased.

In accordance with the solid-state image pickup device 1 including the pixels 2 according to the first to fifth embodiments, it is possible to use a solid-state image pickup device that suppresses increase of dark current while increasing the saturated charge amount by including the two-stage photoelectric converter of the front PD and the pinned PD stacked in the substrate depth direction, the charge accumulation region of the plane-direction PN junction region in the substrate plane direction, and the charge accumulation region of the perpendicular-direction PN junction region formed on the side wall of the pixel isolation section 51.

Usage Examples of Image Sensor

Figure 16:
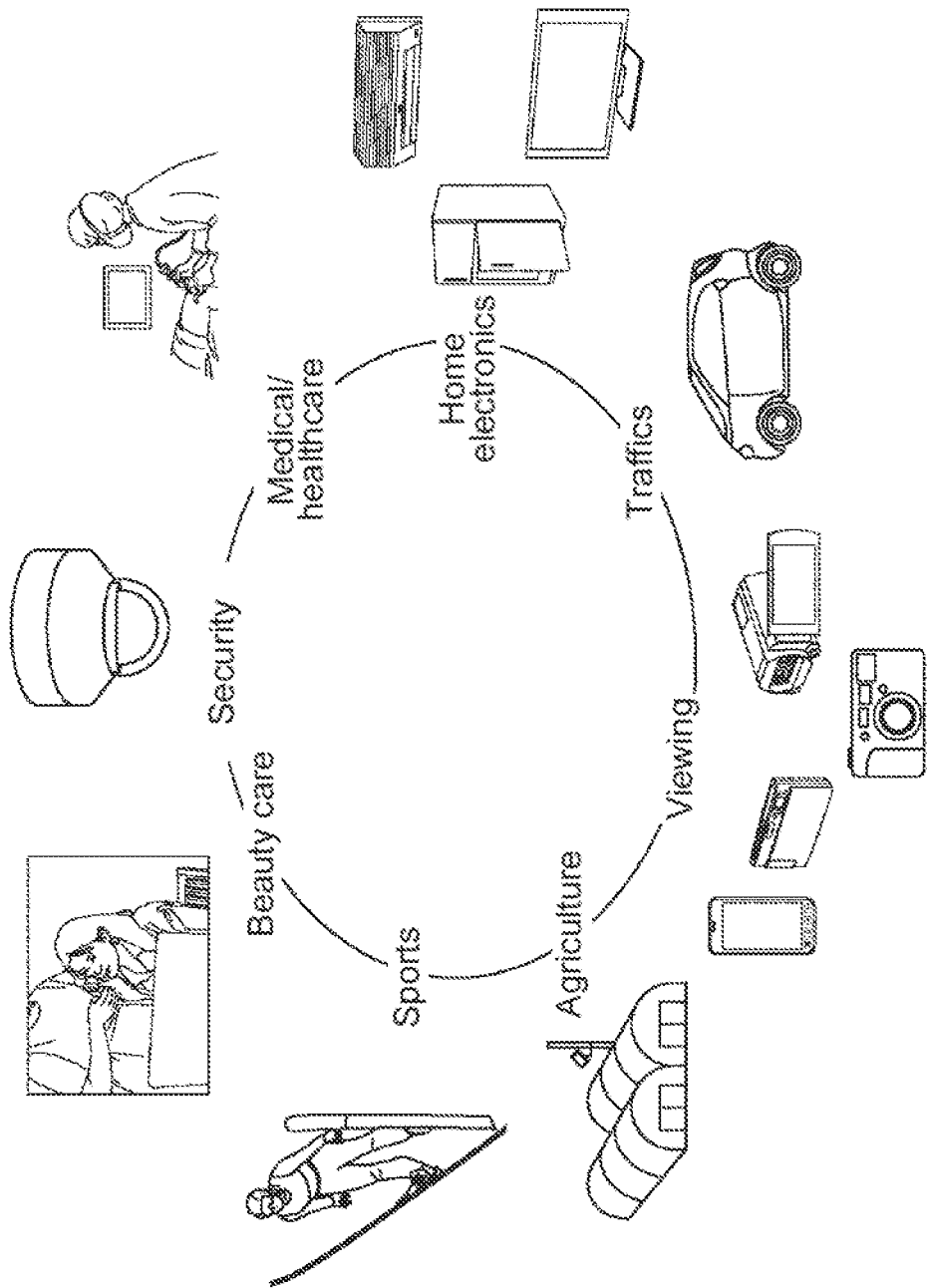
FIG. 16 A diagram describing usage examples of an image sensor.

FIG. 16 is a diagram showing usage examples of an image sensor using the above-mentioned solid-state image pickup device 1.

The image sensor using the above-mentioned solid-state image pickup device 1 can be used in various cases of sensing light such as visible light, infrared light, ultraviolet light, and X-rays as follows, for example.

- An apparatus for photographing images to be viewed, such as a digital camera and a camera-equipped mobile apparatus
- An apparatus used for traffic purposes, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver condition, and the like
- An apparatus used in home electronics such as a TV, a refrigerator, and an air conditioner, for photographing gestures of users and executing apparatus operations according to the gestures
- An apparatus used for medical and healthcare purposes, such as an endoscope and an apparatus that performs blood vessel photographing by receiving infrared light
- An apparatus used for security purposes, such as a surveillance camera for crime-prevention purposes and a camera for person authentication purposes
- An apparatus used for beauty care purposes, such as a skin measurement apparatus that photographs skins and a microscope that photographs scalps An apparatus used for sports purposes, such as an action camera and a wearable camera for sports purposes An apparatus for agriculture purposes, such as a camera for monitoring states of fields and crops

9. Example of Application to Electronic Apparatus

The present technology is not limited to application to the image sensor. Specifically, the present technology is applicable to general electronic apparatuses each using the solid-state image pickup device in an image capturing portion (photoelectric converter). The general electronic apparatuses include imaging apparatuses such as a digital still camera and a video camera, a portable terminal apparatus having an imaging function, a copy machine using the solid-state image pickup device in an image reader, and the like. The solid-state image pickup device may be in the form of one chip or may be in the form of a module having an imaging function in which an image capture unit and a signal processing unit or an optical system are packaged together.

Figure 17:
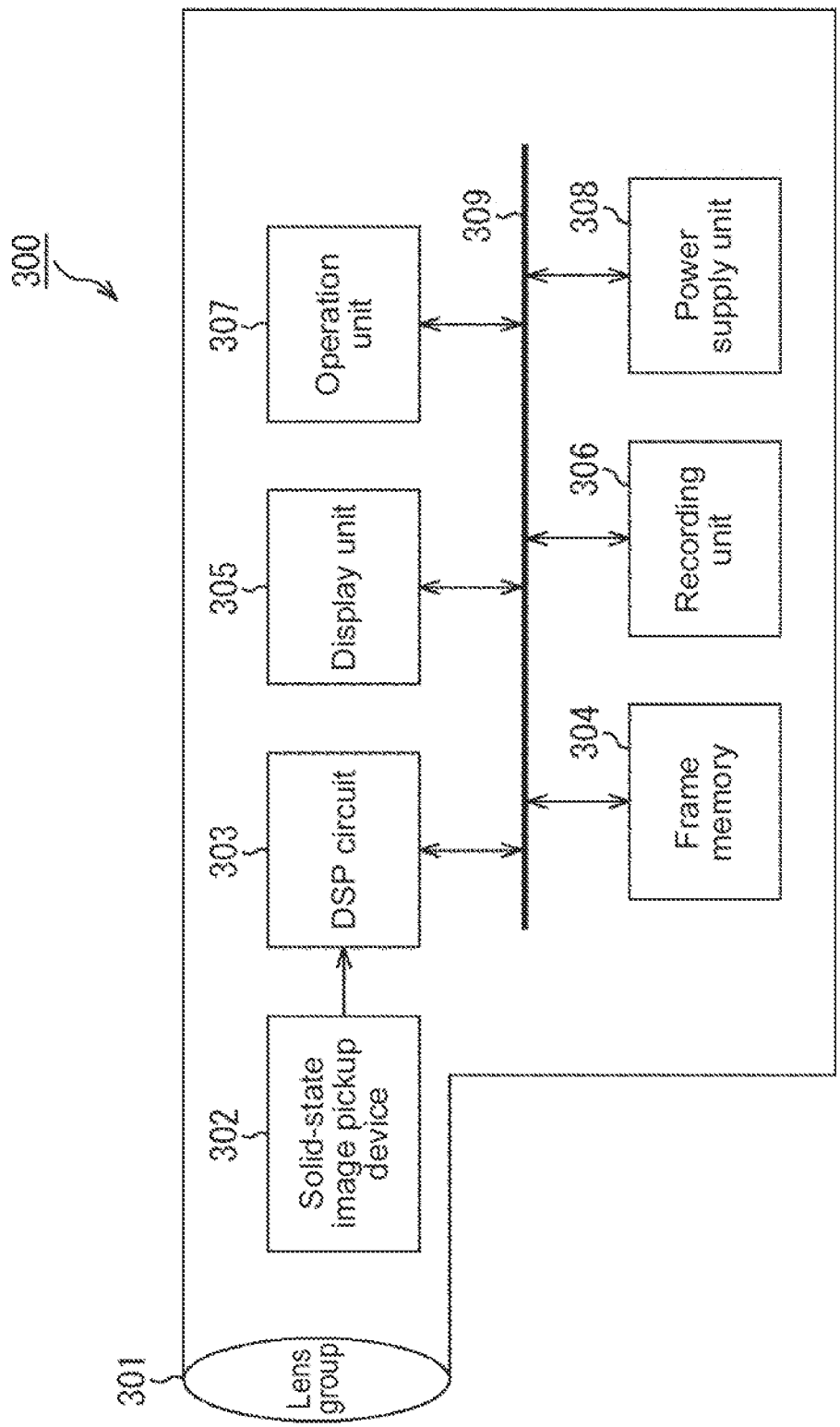
FIG. 17 A block diagram showing a configuration example of an imaging apparatus serving as an electronic apparatus to which the present technology is applied.

FIG. 17 is a block diagram showing a configuration example of an imaging apparatus serving as an electronic apparatus to which the present technology is applied.

An imaging apparatus 300 of FIG. 17 includes an optical unit 301 formed of a lens group and the like, a solid-state image pickup device (image pickup device) 302 in which the configuration of the solid-state image pickup device 1 of FIG. 1 is employed, and a digital signal processor (DSP) circuit 303 that is a camera signal processing circuit. Further, the imaging apparatus 300 also includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to one another via a bus line 309.

The optical unit 301 captures incident light (image light) from an object and forms an image on an imaging surface of a solid-state image pickup device 302. The solid-state image pickup device 302 converts the amount of incident light, of which the image is formed on the imaging surface by the optical unit 301, into electric signals on a pixel-by-pixel basis and outputs them as pixel signals. The solid-state image pickup device 1 of FIG. 1, that is, the solid-state image pickup device including the two-stage photoelectric converter of the front PD and the pinned PD stacked in the substrate depth direction, the charge accumulation region of the plane-direction PN junction region in the substrate plane direction, and the charge accumulation region of the perpendicular-direction PN junction region formed on the side wall of the pixel isolation section 51 is employed as this solid-state image pickup device 302.

The display unit 305 includes, for example, a thin-type display such as a liquid crystal display (LCD) and an organic electro luminescence (EL) display. The display unit 305 displays moving images or still images captured by the solid-state image pickup device 302. The recording unit 306 records moving images or still images captured by the solid-state image pickup device 302 on a recording medium such as a hard disk and a semiconductor memory.

The operation unit 307 issues operation commands regarding various functions of the imaging apparatus 300 in accordance with user's operations. The power supply unit 308 appropriately supplies various power supplies that become operation power supplies for the DSP circuit 303, the frame memory 304, the display unit 305, the recording unit 306, and the operation unit 307 to these supply targets.

As described above, the solid-state image pickup device 1 to which any of the above-mentioned embodiments is applied is used as the solid-state image pickup device 302. In this manner, deterioration of dark current can be suppressed while increasing the saturated charge amount. Thus, also in the imaging apparatus 100 such as a video camera or a digital still camera, and further a camera module for a mobile device such as a mobile phone, the quality of captured images can be improved.

10. Example of Application to Internal Information Acquisition System

The technology according to the present disclosure (present technology) may be applied to various products. For example, the technology according to the present disclosure may be applied to an internal information acquisition system.

Figure 18:
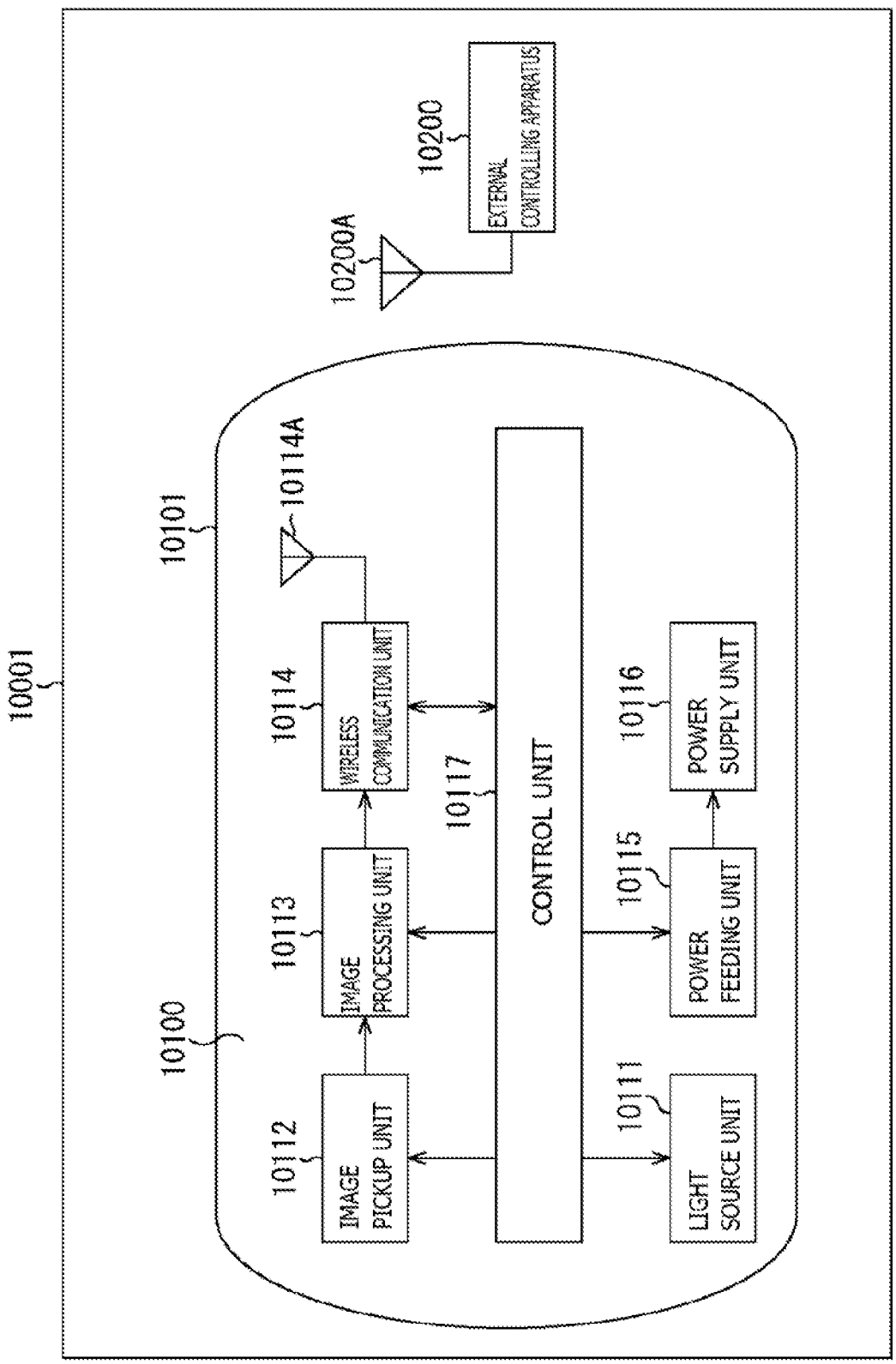
FIG. 18 A block diagram depicting an example of a schematic configuration of an in-vivo information acquisition system.

FIG. 18 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element.

Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 18, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The above describes an example of the in-vivo information acquisition system to which the technology according to the present disclosure may be applied. The technology according to the present disclosure may be applied to the image pickup unit 10112 of the above-mentioned configurations. Specifically, the solid-state image pickup device 1 including the pixels according to the first to fifth embodiments can be applied as the image pickup unit 10112. By applying the technology according to the present disclosure to the image pickup unit 10112, a clearer surgical region image can be obtained. Therefore, the accuracy of examination is improved.

11. Example of Application to Endoscopic Surgery System

The technology according to the present disclosure (present technology) can be applied to various products. For example, the technology according to the present disclosure may be applied to an endoscopic surgery system.

Figure 19:
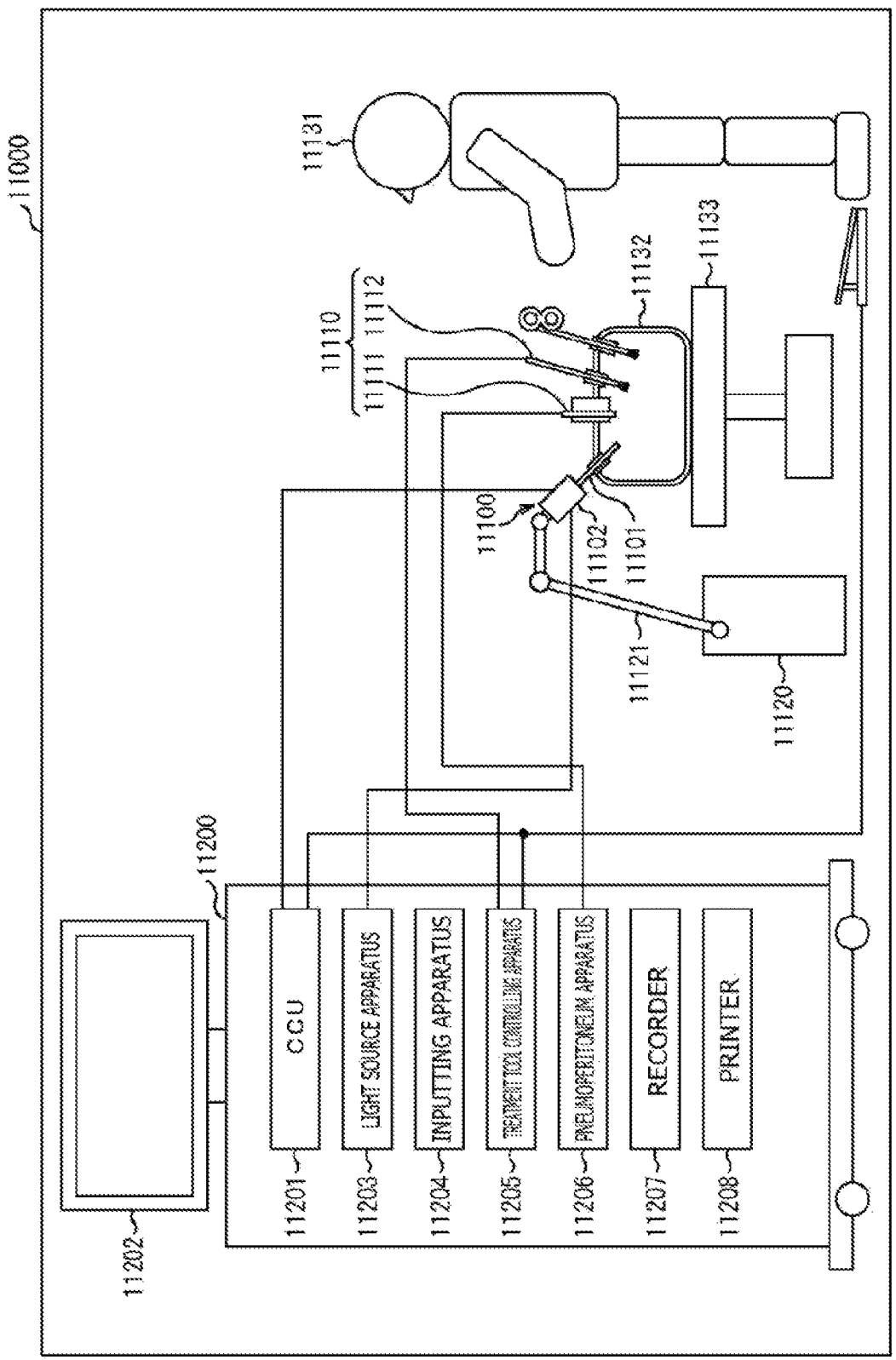
FIG. 19 A view depicting an example of a schematic configuration of an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 20:
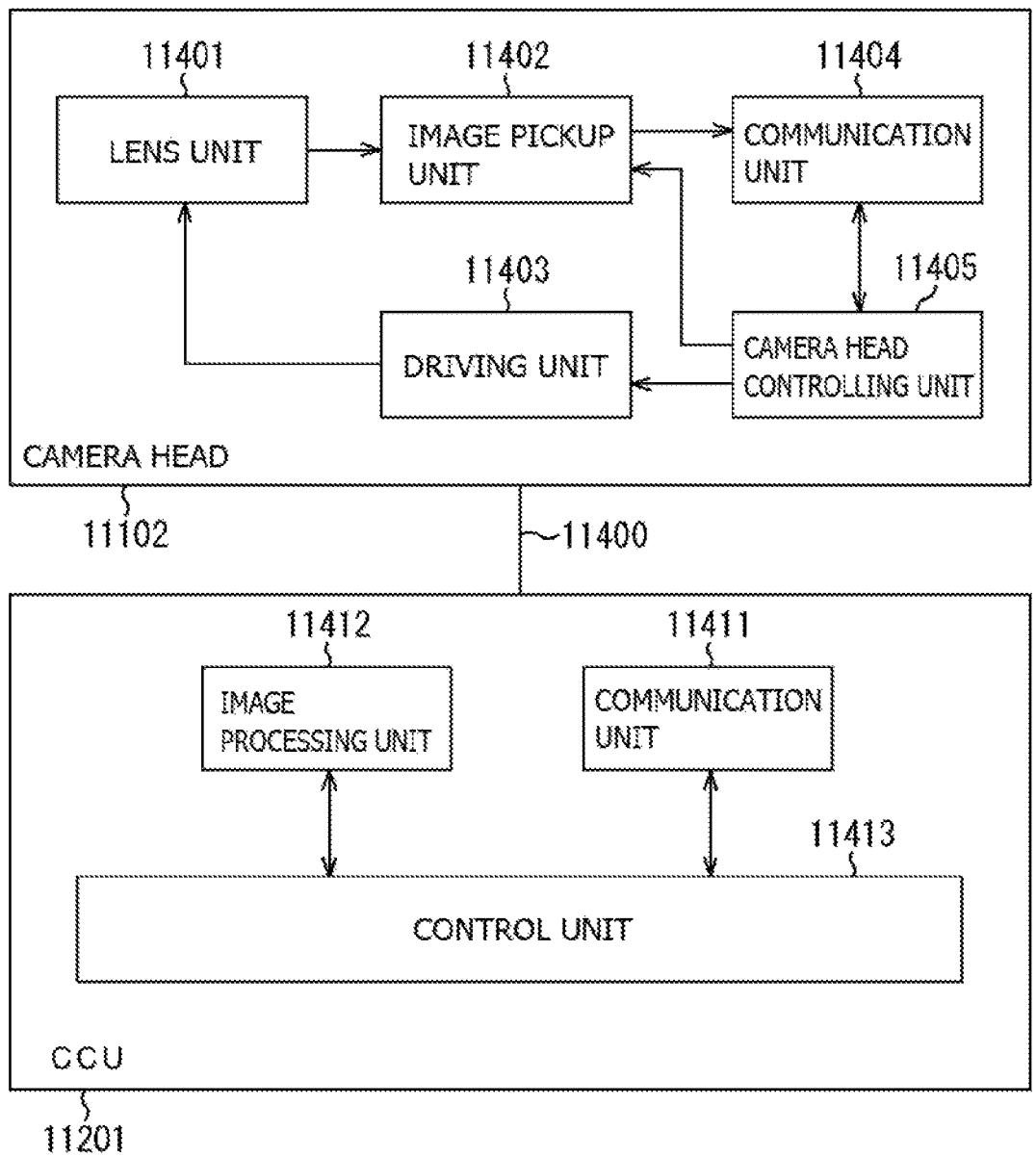
FIG. 20 A block diagram depicting an example of a functional configuration of a camera head and a camera control unit (CCU).

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above describes an example of the endoscopic surgery system to which the technology according to the present disclosure may be applied. The technology according to the present disclosure may be applied to the image pickup unit 11402 of the camera head 11102 of the above-mentioned configurations. Specifically, the solid-state image pickup device 1 including the pixels according to the first to fifth embodiments can be applied as the image pickup unit 11402. By applying the technology according to the present disclosure to the image pickup unit 11402, a clearer surgical region image can be obtained.

Note that, here, while the endoscopic surgery system has been described as an example, the technology according to the present disclosure may be applied to another system, for example, a microscope surgery system or the like.

12. Example of Application to Movable Object

The technology according to the present disclosure (present technology) is applicable to various products. For example, the technology according to the present disclosure may be realized as an apparatus mounted on any type of movable objects including an automobile, an electric vehicle, a hybrid electric vehicle, a motorcycle, a bicycle, a personal mobility, an airplane, a drone, a ship, a robot, and the like.

Figure 21:
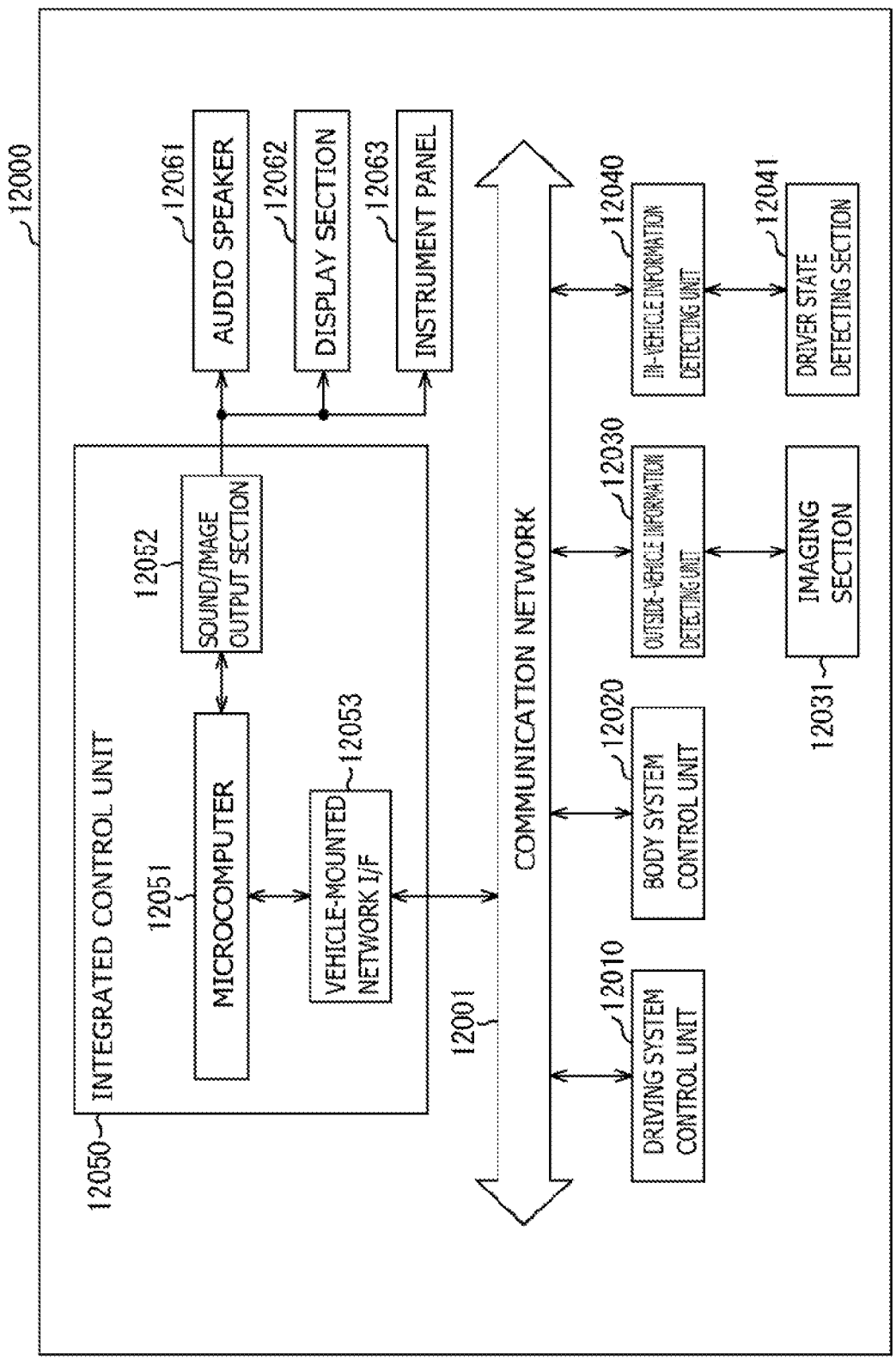
FIG. 21 A block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
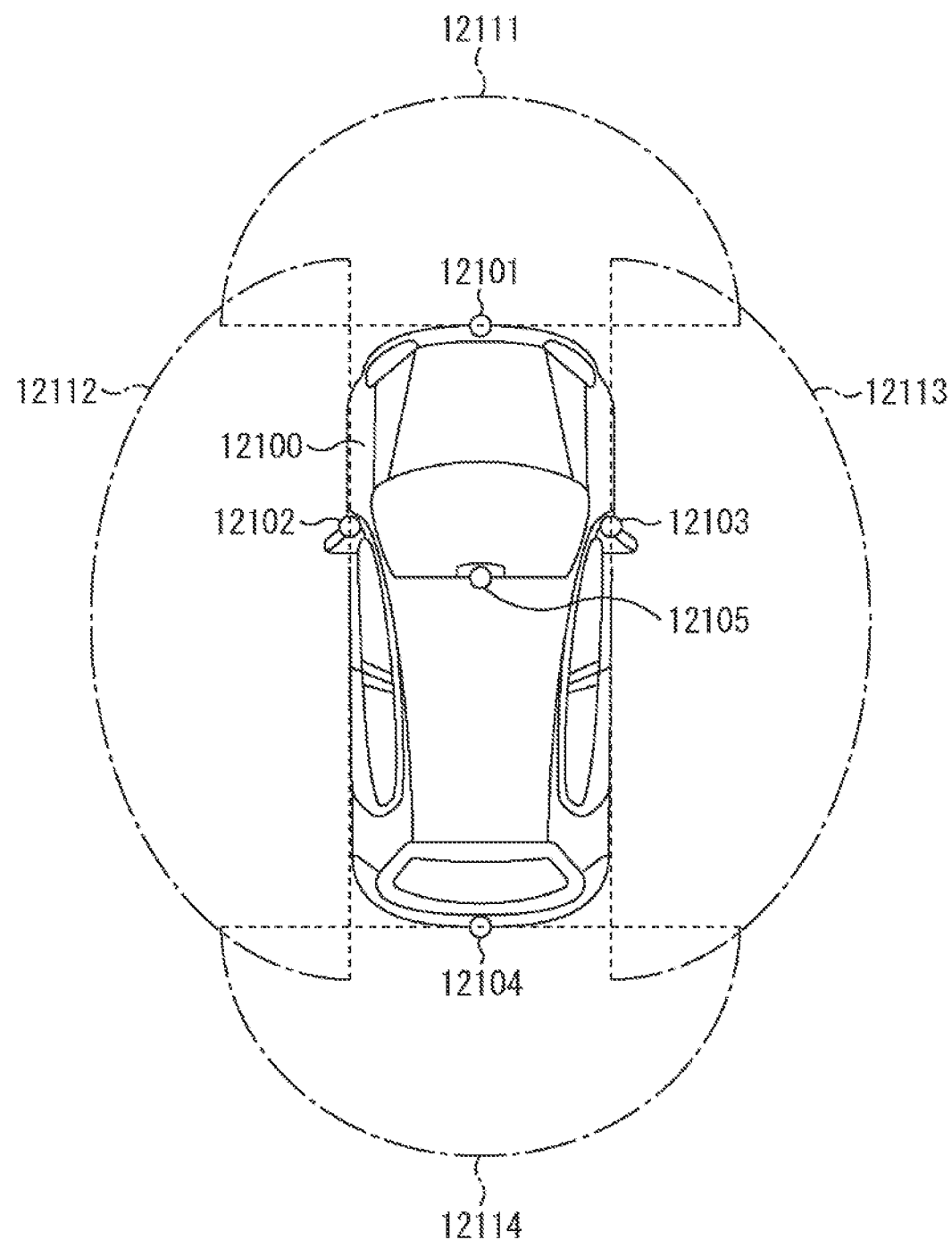
FIG. 22 A diagram of assistance in explaining an example of installation positions of an outside-vehicle information detecting section and an imaging section.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above describes an example of the vehicle control system to which the technology according to the present disclosure may be applied. The technology according to the present disclosure may be applied to the imaging section 12031 of the above-mentioned configurations. Specifically, the solid-state image pickup device 1 including the pixels according to the first to fifth embodiments can be applied as the imaging section 12031. By applying the technology according to the present disclosure to the imaging section 12031, a clearer captured image can be obtained. Further, by making use of obtained captured images and distance information, it is possible to reduce fatigue of a driver and improve safety of the driver and the vehicle.

In the above-mentioned example, the solid-state image pickup device in which the first conductivity type is the N-type, the second conductivity type is the P-type, electrons are signal charges has been described above. Alternatively, the present technology can also be applied to the solid-state image pickup device in which electron holes are signal charges. That is, each semiconductor region described above can be constituted by a semiconductor region of an opposite conductivity type by setting the first conductivity type to be the P-type and the second conductivity type to be the N-type.

Further, the present technology is not limited to the application of the solid-state image pickup device that senses a distribution of incident light amounts of visible light and captures it as an image. The present technology is applicable to a solid-state image pickup device that captures a distribution of incident amounts of infrared rays, X-rays, particles, or the like as an image. As a broader meaning, the present technology is applicable to a general solid-state image pickup device (physical quantity distribution detection device) such as a fingerprint detection sensor that senses a distribution of other physical quantity such as a pressure and capacitance and captures it as an image.

Further, the present technology is not limited to the solid-state image pickup device and is applicable to general semiconductor apparatuses having other semiconductor integrated circuits.

Embodiments of the present technology are not limited to the above-mentioned embodiments but various modifications can be made without departing from the gist of the present technology.

For example, an embodiment in which all or some of the plurality of embodiments described above are combined may be employed.

It should be noted that the effects described in the present specification are merely illustrative and not limitative and other effects may be given.

It should be noted that the present technology can also take the following configurations.

(1) A solid-state image pickup device, including:
a first photoelectric converter formed on a front surface side opposite to a light incident surface side of a substrate;
a second photoelectric converter stacked on the first photoelectric converter in a substrate depth direction; and
a pixel isolation section formed at a boundary portion to an adjacent pixel, the pixel isolation section passing through the substrate, in which
the first photoelectric converter includes
a first plane-direction PN junction region in which a P-type impurity region and an N-type impurity region are joined with each other in a plane direction parallel to a light incident surface of the substrate, and
a first perpendicular-direction PN junction region in which a P-type impurity region and an N-type impurity region are joined with each other in a plane direction perpendicular to the light incident surface along a side wall of the pixel isolation section,
the second photoelectric converter includes
a second plane-direction PN junction region in which a P-type impurity region and an N-type impurity region are joined with each other in a plane direction parallel to the light incident surface, and
a second perpendicular-direction PN junction region in which a P-type impurity region and an N-type impurity region are joined with each other in the plane direction perpendicular to the light incident surface along the side wall of the pixel isolation section,
an impurity region of a first conductivity type of the first perpendicular-direction PN junction region is disposed apart from an impurity region of a second conductivity type of the second plane-direction PN junction region by a first distance in the substrate depth direction, the second conductivity type being opposite to the first conductivity type, and
an impurity region of the first conductivity type of the second perpendicular-direction PN junction region is disposed apart from an impurity region of the second conductivity type of a back-surface-side interface of the substrate by a second distance in the substrate depth direction.
(2) The solid-state image pickup device according to (1), further including:
a charge retention section that retains charges generated in the first photoelectric converter and the second photoelectric converter; and
a transfer transistor that transfers the charges to the charge retention section, in which
the transfer transistor is formed as a vertical transistor including a gate electrode that extends from the front surface side of the substrate in the substrate depth direction and reaches the second photoelectric converter.
(3) The solid-state image pickup device according to (1), further including:
a charge retention section that retains charges generated in the first photoelectric converter and the second photoelectric converter; and
a transfer transistor that transfers the charges to the charge retention section, in which
the impurity region of the first conductivity type that constitutes the second photoelectric converter is held in contact with a front-surface-side interface of the substrate.
(4) The solid-state image pickup device according to any of (1) to (3), in which
the charge retention section is shared with a plurality of pixels, and
the pixel isolation section is formed at the boundary portion between sharing units.
(5) The solid-state image pickup device according to any of (1) to (4), in which
the second distance is set to be longer than the first distance.
(6) The solid-state image pickup device according to any of (1) to (5), further including
a three-dimensional PN junction region including two or more PN junction regions within the impurity region of the first conductivity type that constitutes the first photoelectric converter.
(7) The solid-state image pickup device according to any of (1) to (6), further including
a three-dimensional PN junction region including two or more PN junction regions within the impurity region of the first conductivity type that constitutes the second photoelectric converter.
(8) The solid-state image pickup device according to any of (1) to (7), in which
the second photoelectric converter includes
a plurality of second plane-direction PN junction regions each of which is the second plane-direction PN junction region, and
a plurality of second perpendicular-direction PN junction regions each of which is the second perpendicular-direction PN junction region.
(9) The solid-state image pickup device according to (8), in which
assuming that the plurality of second plane-direction PN junction regions and the plurality of second perpendicular-direction PN junction regions are respectively referred to as a third plane-direction PN junction region, a third perpendicular-direction PN junction region, a fourth plane-direction PN junction region, and a fourth perpendicular-direction PN junction region from a side of the first photoelectric converter,
an impurity region of the second conductivity type of the fourth plane-direction PN junction region is disposed apart from an impurity region of the first conductivity type of the third perpendicular-direction PN junction region by a third distance in the substrate depth direction.
(10) The solid-state image pickup device according to any of (1) to (9), in which
the pixel isolation section includes one or both of polysilicon and an oxide film.
(11) The solid-state image pickup device according to any of (1) to (10), in which
the pixel isolation section further includes a shallow trench isolation (STI) on the front surface side of the substrate.
(12) A manufacturing method for a solid-state image pickup device, including:
forming a first photoelectric converter on a front surface side opposite to a light incident surface side of a substrate;
forming a second photoelectric converter stacked on the first photoelectric converter in a substrate depth direction; and
forming a pixel isolation section at a boundary portion to an adjacent pixel, the pixel isolation section passing through the substrate, in which
the first photoelectric converter includes
a first plane-direction PN junction region in which a P-type impurity region and an N-type impurity region are joined with each other in a plane direction parallel to a light incident surface of the substrate, and
a first perpendicular-direction PN junction region in which a P-type impurity region and an N-type impurity region are joined with each other in a plane direction perpendicular to the light incident surface along a side wall of the pixel isolation section, the second photoelectric converter includes
  a second plane-direction PN junction region in which a P-type impurity region and an N-type impurity region are joined with each other in a plane direction parallel to the light incident surface, and
  a second perpendicular-direction PN junction region in which a P-type impurity region and an N-type impurity region are joined with each other in the plane direction perpendicular to the light incident surface along the side wall of the pixel isolation section, an impurity region of a first conductivity type of the first perpendicular-direction PN junction region is formed apart from an impurity region of a second conductivity type of the second plane-direction PN junction region by a first distance in the substrate depth direction, the second conductivity type being opposite to the first conductivity type, and an impurity region of the first conductivity type of the second perpendicular-direction PN junction region is formed apart from an impurity region of the second conductivity type of a back-surface-side interface of the substrate by a second distance in the substrate depth direction.

(13) An electronic apparatus, including
  a solid-state image pickup device including
    a first photoelectric converter formed on a front surface side opposite to a light incident surface side of a substrate,
    a second photoelectric converter stacked on the first photoelectric converter in a substrate depth direction, and
    a pixel isolation section formed at a boundary portion to an adjacent pixel, the pixel isolation section passing through the substrate, in which
  the first photoelectric converter includes
    a first plane-direction PN junction region in which a P-type impurity region and an N-type impurity region are joined with each other in a plane direction parallel to a light incident surface of the substrate, and
    a first perpendicular-direction PN junction region in which a P-type impurity region and an N-type impurity region are joined with each other in a plane direction perpendicular to the light incident surface along a side wall of the pixel isolation section,
  the second photoelectric converter includes
    a second plane-direction PN junction region in which a P-type impurity region and an N-type impurity region are joined with each other in a plane direction parallel to the light incident surface, and
    a second perpendicular-direction PN junction region in which a P-type impurity region and an N-type impurity region are joined with each other in the plane direction perpendicular to the light incident surface along the side wall of the pixel isolation section,
  an impurity region of a first conductivity type of the first perpendicular-direction PN junction region is disposed apart from an impurity region of a second conductivity type of the second plane-direction PN junction region by a first distance in the substrate depth direction, the second conductivity type being opposite to the first conductivity type, and
  an impurity region of the first conductivity type of the second perpendicular-direction PN junction region is disposed apart from an impurity region of the second conductivity type of a back-surface-side interface of the substrate by a second distance in the substrate depth direction.

REFERENCE SIGNS LIST 1 solid-state image pickup device
2 pixel
3 pixel array section
12 semiconductor substrate
Tr1 to Tr3 shared pixel transistor
41, 42 N-type impurity region
43 P-type impurity region
44, 45 N-type impurity region
46 P-type impurity region
47 FD
48 transfer transistor
51 pixel isolation section
52 P-type impurity region
61 P-type impurity region
62, 63 N-type impurity region
64 STI
81 polysilicon
82 oxide film
171 P-type impurity region
172 N-type impurity region
181 P-type impurity region
182 N-type impurity region
300 imaging apparatus
302 solid-state image pickup device

The invention claimed is:
1. A solid-state image pickup device, comprising:
  a first photoelectric converter formed on a front surface side opposite to a light incident surface side of a substrate;
  a second photoelectric converter stacked on the first photoelectric converter in a substrate depth direction; and
  a pixel isolation section formed at a boundary portion to an adjacent pixel, the pixel isolation section passing through the substrate, wherein
  the first photoelectric converter includes
    a first plane-direction PN junction region in which a P-type impurity region and an N-type impurity region are joined with each other in a plane direction parallel to a light incident surface of the substrate, and
    a first perpendicular-direction PN junction region in which a P-type impurity region and an N-type impurity region are joined with each other in a plane direction perpendicular to the light incident surface along a side wall of the pixel isolation section,
  the second photoelectric converter includes
    a second plane-direction PN junction region in which a P-type impurity region and an N-type impurity region are joined with each other in the plane direction parallel to the light incident surface, and
    a second perpendicular-direction PN junction region in which a P-type impurity region and an N-type impurity region are joined with each other in the plane direction perpendicular to the light incident surface along the side wall of the pixel isolation section,
  an impurity region of a first conductivity type of the first perpendicular-direction PN junction region is disposed apart from an impurity region of a second conductivity type of the second plane-direction PN junction region by a first distance in the substrate depth direction, the second conductivity type being opposite to the first conductivity type, and an impurity region of the first conductivity type of the second perpendicular-direction PN junction region is disposed apart from an impurity region of the second conductivity type of a back-surface-side interface of the substrate by a second distance in the substrate depth direction.

2. The solid-state image pickup device according to claim 1, further comprising:
a charge retention section that retains charges generated in the first photoelectric converter and the second photoelectric converter; and
a transfer transistor that transfers the charges to the charge retention section, wherein
the transfer transistor is formed as a vertical transistor including a gate electrode that extends from the front surface side of the substrate in the substrate depth direction and reaches the second photoelectric converter.

3. The solid-state image pickup device according to claim 1, further comprising:
a charge retention section that retains charges generated in the first photoelectric converter and the second photoelectric converter; and
a transfer transistor that transfers the charges to the charge retention section, wherein
an impurity region of the first conductivity type that constitutes the second photoelectric converter is held in contact with the front-surface-side of the substrate.

4. The solid-state image pickup device according to claim 1, wherein
a charge retention section is shared with a plurality of pixels, and
the pixel isolation section is formed at the boundary portion between sharing units.

5. The solid-state image pickup device according to claim 1, wherein
the second distance is set to be longer than the first distance.

6. The solid-state image pickup device according to claim 1, further comprising
a three-dimensional PN junction region including two or more PN junction regions within an impurity region of the first conductivity type that constitutes the first photoelectric converter.

7. The solid-state image pickup device according to claim 1, further comprising
a three-dimensional PN junction region including two or more PN junction regions within an impurity region of the first conductivity type that constitutes the second photoelectric converter.

8. The solid-state image pickup device according to claim 1, wherein
the second photoelectric converter includes
a plurality of second plane-direction PN junction regions each of which is the second plane-direction PN junction region, and
a plurality of second perpendicular-direction PN junction regions each of which is the second perpendicular-direction PN junction region.

9. The solid-state image pickup device according to claim 8, wherein
the plurality of second plane-direction PN junction regions and the plurality of second perpendicular-direction PN junction regions comprise the second plane-direction PN junction region, the second perpendicular-direction PN junction region, a third plane-direction PN junction region, and a third perpendicular-direction PN junction region, and
an impurity region of the second conductivity type of the second plane-direction PN junction region is disposed apart from an impurity region of the first conductivity type of the third perpendicular-direction PN junction region by a third distance in the substrate depth direction.

10. The solid-state image pickup device according to claim 9, wherein
the pixel isolation section further includes a shallow trench isolation (STI) on the front surface side of the substrate.

11. The solid-state image pickup device according to claim 1, wherein
the pixel isolation section includes one or both of polysilicon and an oxide film.

12. A manufacturing method for a solid-state image pickup device, comprising:
forming a first photoelectric converter on a front surface side opposite to a light incident surface side of a substrate;
forming a second photoelectric converter stacked on the first photoelectric converter in a substrate depth direction; and
forming a pixel isolation section at a boundary portion to an adjacent pixel, the pixel isolation section passing through the substrate, wherein
the first photoelectric converter includes
a first plane-direction PN junction region in which a P-type impurity region and an N-type impurity region are joined with each other in a plane direction parallel to a light incident surface of the substrate, and
a first perpendicular-direction PN junction region in which a P-type impurity region and an N-type impurity region are joined with each other in a plane direction perpendicular to the light incident surface along a side wall of the pixel isolation section,
the second photoelectric converter includes
a second plane-direction PN junction region in which a P-type impurity region and an N-type impurity region are joined with each other in the plane direction parallel to the light incident surface, and
a second perpendicular-direction PN junction region in which a P-type impurity region and an N-type impurity region are joined with each other in the plane direction perpendicular to the light incident surface along the side wall of the pixel isolation section,
an impurity region of a first conductivity type of the first perpendicular-direction PN junction region is formed apart from an impurity region of a second conductivity type of the second plane-direction PN junction region by a first distance in the substrate depth direction, the second conductivity type being opposite to the first conductivity type, and
an impurity region of the first conductivity type of the second perpendicular-direction PN junction region is formed apart from an impurity region of the second conductivity type of a back-surface-side interface of the substrate by a second distance in the substrate depth direction.

13. An electronic apparatus, comprising
a solid-state image pickup device including
- a first photoelectric converter formed on a front surface side opposite to a light incident surface side of a substrate,
- a second photoelectric converter stacked on the first photoelectric converter in a substrate depth direction, and
- a pixel isolation section formed at a boundary portion to an adjacent pixel, the pixel isolation section passing through the substrate, in which the first photoelectric converter includes
- a first plane-direction PN junction region in which a P-type impurity region and an N-type impurity region are joined with each other in a plane direction parallel to a light incident surface of the substrate, and
- a first perpendicular-direction PN junction region in which a P-type impurity region and an N-type impurity region are joined with each other in a plane direction perpendicular to the light incident surface along a side wall of the pixel isolation section, the second photoelectric converter includes
- a second plane-direction PN junction region in which a P-type impurity region and an N-type impurity region are joined with each other in the plane direction parallel to the light incident surface, and
- a second perpendicular-direction PN junction region in which a P-type impurity region and an N-type impurity region are joined with each other in the plane direction perpendicular to the light incident surface along the side wall of the pixel isolation section, an impurity region of a first conductivity type of the first perpendicular-direction PN junction region is disposed apart from an impurity region of a second conductivity type of the second plane-direction PN junction region by a first distance in the substrate depth direction, the second conductivity type being opposite to the first conductivity type, and an impurity region of the first conductivity type of the second perpendicular-direction PN junction region is disposed apart from an impurity region of the second conductivity type of a back-surface-side interface of the substrate by a second distance in the substrate depth direction.

* * * * *